United States Patent
Song et al.

(10) Patent No.: US 12,063,813 B2
(45) Date of Patent: Aug. 13, 2024

(54) DISPLAY SUBSTRATE, PREPARATION METHOD THEREFOR AND DISPLAY APPARATUS

(71) Applicant: BOE Technology Group Co., Ltd., Beijing (CN)

(72) Inventors: Zhen Song, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 608 days.

(21) Appl. No.: 17/288,571

(22) PCT Filed: Aug. 3, 2020

(86) PCT No.: PCT/CN2020/106544
§ 371 (c)(1),
(2) Date: Apr. 26, 2021

(87) PCT Pub. No.: WO2021/023147
PCT Pub. Date: Feb. 11, 2021

(65) Prior Publication Data
US 2021/0391402 A1    Dec. 16, 2021

(30) Foreign Application Priority Data
Aug. 6, 2019  (CN) .......................... 201910720928.X

(51) Int. Cl.
*H10K 59/121*    (2023.01)
*H10K 59/126*    (2023.01)
(Continued)

(52) U.S. Cl.
CPC ..... *H10K 59/1213* (2023.02); *H10K 59/1216* (2023.02); *H10K 59/126* (2023.02);
(Continued)

(58) Field of Classification Search
CPC .......... H10K 59/1213; H10K 59/1216; H10K 59/126; H10K 59/131; H10K 59/353;
(Continued)

(56) References Cited

U.S. PATENT DOCUMENTS

2003/0202149 A1    10/2003  Miyajima et al.
2006/0119753 A1    6/2006   Luo et al.
(Continued)

FOREIGN PATENT DOCUMENTS

CN    1453616 A    11/2003
CN    1680861 A    10/2005
(Continued)

OTHER PUBLICATIONS

Office Action dated Mar. 25, 2021 for Chinese Patent Application No. 201910720928.X and English Translation.
(Continued)

*Primary Examiner* — Kyoung Lee
(74) *Attorney, Agent, or Firm* — Ling Wu; Stephen Yang; Ling and Yang Intellectual Property

(57) ABSTRACT

A display substrate, includes a plurality of subpixels arranged in a matrix. Each subpixel is provided with a pixel driver circuit that includes a plurality of thin film transistors and a storage capacitor. The storage capacitor of a present subpixel among the plurality of subpixels and the storage capacitor of an adjacent subpixel adjacent to the current subpixel are disposed in a shared capacitance region of the present subpixel and the adjacent subpixel, and the storage capacitor of the present subpixel and the storage capacitor of the adjacent subpixel are stacked.

14 Claims, 12 Drawing Sheets

(51) Int. Cl.
  *H10K 59/131* (2023.01)
  *H10K 59/35* (2023.01)
  *H10K 59/38* (2023.01)
  *H10K 59/12* (2023.01)

(52) U.S. Cl.
  CPC ......... *H10K 59/131* (2023.02); *H10K 59/353* (2023.02); *H10K 59/38* (2023.02); *H10K 59/1201* (2023.02)

(58) Field of Classification Search
  CPC ............... H10K 59/38; H10K 59/1201; H10K 59/1315; H01L 27/1255
  See application file for complete search history.

(56) References Cited

U.S. PATENT DOCUMENTS

| | | | | |
|---|---|---|---|---|
| 2008/0035927 | A1* | 2/2008 | Yamazaki | H01L 27/124 257/E27.113 |
| 2011/0149184 | A1* | 6/2011 | Tsai | G02F 1/136213 349/38 |
| 2016/0372497 | A1* | 12/2016 | Lee | H01L 27/1255 |
| 2018/0175077 | A1* | 6/2018 | Koo | H10K 59/126 |
| 2021/0183911 | A1 | 6/2021 | Xiao et al. | |

FOREIGN PATENT DOCUMENTS

| | | |
|---|---|---|
| CN | 101738804 A | 6/2010 |
| CN | 101924122 A | 12/2010 |
| CN | 105159002 A | 12/2015 |
| CN | 107785399 A | 3/2018 |
| CN | 108550582 A | 9/2018 |
| CN | 109378326 A | 2/2019 |
| CN | 110416278 A | 11/2019 |

OTHER PUBLICATIONS

Office Action dated Aug. 30, 2021 for Chinese Patent Application No. 201910720928.X and English Translation.
International Search Report for PCT/CN2020/106544 Mailed Oct. 12, 2020.
Jintian He et al., Automatic Display Technology and Meter, Apr. 30, 2008, pp. 214-219, Xi'an University of Electronic Science and Technology Press.
Shixin Pei et al., Principle and Application of Optoelectronics Technology, Aug. 31, 2016, pp. 258-264, National Defense Industry Press.

* cited by examiner

DISPLAY SUBSTRATE, PREPARATION METHOD THEREFOR AND DISPLAY APPARATUS

CROSS-REFERENCE TO RELATED APPLICATIONS

The present application is a U.S. National Phase Entry of International Application No. PCT/CN2020/106544 having an international filing date of Aug. 3, 2020, which claims the priority of Chinese patent application No. 201910720928.X, filed to the CNIPA on Aug. 6, 2019 and entitled "Display Substrate, Preparation Method Thereof and Display Apparatus". The entire contents of the above-identified applications are hereby incorporated by reference.

TECHNICAL FIELD

Embodiments of the present disclosure relate to, but are not limited to, the field of display technology, and specifically relate to a display substrate and a preparation method thereof, and a display apparatus.

BACKGROUND

Organic Light Emitting Diode (abbreviated as OLED) display apparatuses have advantages such as ultra-thinness, large viewing angle, active light emission, high brightness, continuous and adjustable color of emitted light, low cost, fast response, low power consumption, wide operating temperature range and flexible display, and have gradually become an extremely promising next generation display technology. According to different drive modes, OLEDs may be divided into two types, Passive Matrix (abbreviated as PM) type and Active Matrix (abbreviated as AM) type, wherein an AMOLED is a current-driven device, in which an independent Thin Film Transistor (abbreviated as TFT) is used to control each sub-pixel, and each sub-pixel may be continuously and independently driven to emit light.

SUMMARY

The following is a summary of subject matter described in detail herein. This summary is not intended to limit the protection scope of the claims.

According to at least one embodiment of the present disclosure, a display substrate is provided, including multiple sub-pixels arranged in a matrix, wherein each sub-pixel is provided with a pixel drive circuit including multiple thin film transistors and a storage capacitor, the storage capacitor of a present sub-pixel in the multiple sub-pixels and the storage capacitor of an adjacent sub-pixel adjacent to the present sub-pixel are disposed in a shared capacitance region of the present sub-pixel and the adjacent sub-pixel, and the storage capacitor of the present sub-pixel and the storage capacitor of the adjacent sub-pixel are disposed as stacked layers.

In the display substrate according to any one of above embodiments, for example, the storage capacitor of the present sub-pixel includes: a first electrode disposed in a same layer as a light shield layer in the pixel drive circuit, an insulating layer covering the first electrode, and a second electrode disposed in a same layer as gate electrodes of the thin film transistors.

In the display substrate according to any one of above embodiments, for example, the storage capacitor of the adjacent sub-pixel includes: a third electrode disposed in a same layer as source and drain electrodes of the thin film transistors, an insulating layer covering the third electrode, and a fourth electrode disposed in a same layer as a pixel electrode.

In the display substrate according to any one of above embodiments, for example, the pixel drive circuit includes: a base substrate; a light shield layer and a first electrode disposed on the base substrate, wherein the first electrode is disposed in the shared capacitance region; a first insulating layer covering the light shield layer and the first electrode; an active layer disposed on the first insulating layer; a second insulating layer covering the active layer; and gate electrodes and a second electrode disposed on the second insulating layer, wherein the second electrode is disposed in the shared capacitance region, and the first electrode and the second electrode form the storage capacitor of the present sub-pixel.

In the display substrate according to any one of above embodiments, for example, the pixel drive circuit further includes: a third insulating layer covering the gate electrodes and the second electrode; source electrodes, drain electrodes and a third electrode disposed on the third insulating layer, wherein the third electrode is disposed in the shared capacitance region; a fourth insulating layer and a fifth insulating layer covering the source electrodes, the drain electrodes and the third electrode; and a pixel electrode and a fourth electrode disposed on the fifth insulating layer, wherein the fourth electrode is disposed in the shared capacitance region, and the third electrode and the fourth electrode form the storage capacitor of the adjacent sub-pixel.

In the display substrate according to any one of above embodiments, for example, the multiple thin film transistors include a first thin film transistor, a second thin film transistor and a third thin film transistor, the first thin film transistor includes a first active layer, a first gate electrode, a first source electrode and a first drain electrode, the second thin film transistor includes a second active layer, a second gate electrode, a second source electrode and a second drain electrode, and the third thin film transistor includes a third active layer, a third gate electrode, a third source electrode and a third drain electrode.

In the display substrate according to any one of above embodiments, for example, in the present sub-pixel, the first electrode and the light shield layer are in an integrated structure, and the first electrode is connected to the first drain electrode and the third drain electrode through a via hole; the second electrode and the first gate electrode are in an integrated structure, and the second electrode is connected to the second drain electrode through a via hole.

In the display substrate according to any one of above embodiments, for example, in the adjacent sub-pixel, the third electrode is connected to the first gate electrode and the second drain electrode through a via hole, the fourth electrode and the pixel electrode are in an integrated structure, and the fourth electrode is connected to the first drain electrode and the third drain electrode through a via hole.

The display substrate according to any one of above embodiments, for example, further includes a color filter layer, wherein the color filter layer is disposed between the fourth insulating layer and the fifth insulating layer, the fifth insulating layer is opened with a via hole exposing the fourth insulating layer, and the fourth electrode is disposed in the via hole.

In the display substrate according to any one of above embodiments, for example, the pixel drive circuit further includes a switch scan line, a compensation scan line and a data line, and the shared capacitance region is disposed between two data lines in a horizontal direction and between the switch scan line and the compensation scan line in a vertical direction.

According to at least one embodiment of the present disclosure, a display apparatus is provided, which includes a display substrate of any one of above embodiments.

According to at least one embodiment of the present disclosure, a method for preparing a display substrate is provided, which includes: forming multiple sub-pixels arranged in a matrix, forming a pixel drive circuit including multiple thin film transistors and a storage capacitor in each sub-pixel, wherein the storage capacitor of a present sub-pixel in the multiple sub-pixels and the storage capacitor of an adjacent sub-pixel adjacent to the present sub-pixel are formed in a shared capacitance region of the present sub-pixel and the adjacent sub-pixel, and the storage capacitor of the present sub-pixel and the storage capacitor of the adjacent sub-pixel are disposed as stacked layers.

In the method for preparing a display substrate according to any one of above embodiments of the present disclosure, for example, forming the storage capacitor of the present sub-pixel in the shared capacitance region, includes: forming a first electrode disposed in a same layer as a light shield layer in the pixel drive circuit, wherein the first electrode is formed in the shared capacitance region; forming an insulating layer covering the first electrode; and forming a second electrode disposed in a same layer as gate electrodes of the thin film transistors, wherein the second electrode is formed in the shared capacitance region.

In the method for preparing a display substrate according to any one of above embodiments of the present disclosure, for example, forming the storage capacitor of the adjacent sub-pixel in the shared capacitance region, includes: forming a third electrode disposed in a same layer as source and drain electrodes of the thin film transistors, wherein the third electrode is formed in the shared capacitance region; forming an insulating layer covering the third electrode; and forming a fourth electrode disposed in a same layer as a pixel electrode, wherein the fourth electrode is formed in the shared capacitance region.

In the method for preparing a display substrate according to any one of above embodiments of the present disclosure, for example, forming the pixel drive circuit includes: forming a light shield layer and a first electrode on a base substrate, wherein the first electrode is formed in the shared capacitance region; forming a first insulating layer covering the light shield layer and the first electrode; forming an active layer on the first insulating layer; forming a second insulating layer covering the active layer; and forming gate electrodes and a second electrode on the second insulating layer, wherein the second electrode is formed in the shared capacitance region, and the first electrode and the second electrode form the storage capacitor of the present sub-pixel.

In the method for preparing a display substrate according to any one of above embodiments of the present disclosure, for example, forming the pixel drive circuit further includes: forming a third insulating layer covering the gate electrodes and the second electrode; forming source electrodes, drain electrodes and a third electrode on the third insulating layer, wherein the third electrode is formed in the shared capacitance region; forming a fourth insulating layer and a fifth insulating layer covering the source electrodes, the drain electrodes and the third electrode; and forming a pixel electrode and a fourth electrode on the fifth insulating layer, wherein the fourth electrode is formed in the shared capacitance region, and the third electrode and the fourth electrode form the storage capacitor of the adjacent sub-pixel.

In the method for preparing a display substrate according to any one of above embodiments of the present disclosure, for example, forming the light shield layer and the first electrode on the base substrate includes forming a light shield layer of the present sub-pixel and a light shield layer of the adjacent sub-pixel on the base substrate, wherein the light shield layer of the present sub-pixel and the first electrode are in an integrated structure; forming the gate electrodes and the second electrode on the second insulating layer includes forming a first, a second and a third gate electrodes of the present sub-pixel and a first, a second and a third gate electrodes of the adjacent sub-pixel on the second insulating layer, wherein the first gate electrode of the present sub-pixel and the second electrode are in an integrated structure; and forming the pixel electrode and the fourth electrode on the fifth insulating layer includes forming a pixel electrode of the present sub-pixel and a pixel electrode of the adjacent sub-pixel on the fifth insulating layer, wherein the pixel electrode of the adjacent sub-pixel and the fourth electrode are in an integrated structure and the pixel electrode of the adjacent sub-pixel are connected to a first drain electrode and a third drain electrode of the adjacent sub-pixel through a via hole.

In the method for preparing a display substrate according to any one of above embodiments of the present disclosure, for example, forming source electrodes, drain electrodes and a third electrode on the third insulating layer includes: forming a data line, a compensation line, a first source electrode, a first drain electrode, a second source electrode, a second drain electrode, a third source electrode, a third drain electrode and the third electrode on the third insulating layer.

In the method for preparing a display substrate according to any one of above embodiments of the present disclosure, for example, the compensation line is connected to a connection line through a via hole; the first source electrode is connected to a first active layer through a via hole, and the first drain electrode is simultaneously connected to the first active layer and the light shield layer through a via hole, so that the first drain electrode of the present sub-pixel is connected to the first electrode; the second source electrode and the data line are in an integrated structure, the second source electrode is connected to a second active layer through a via hole, and the second drain electrode is simultaneously connected to the second active layer and the first gate electrode through the via hole, to make the second drain electrode of the present sub-pixel be connected to the second electrode; the third source electrode is simultaneously connected to the connection line and a third active layer through a via hole, and the third drain electrode is simultaneously connected to the third active layer and the light shield layer through the via hole, to make the third drain electrode of the present sub-pixel be connected to the first electrode; and the third electrode is connected to the first gate electrode of the adjacent sub-pixel through a via hole.

In the method for preparing a display substrate according to any one of above embodiments of the present disclosure, for example, forming the fourth insulating layer and the fifth insulating layer covering the source electrodes, the drain electrodes and the third electrode includes: forming the fourth insulating layer covering the source electrodes, the drain electrodes and the third electrode; forming a color filter layer on the fourth insulating layer; forming the fifth insulating layer covering the color filter layer, forming a via hole exposing the fourth insulating layer on the fifth insulating layer, wherein the via hole is configured to dispose the fourth electrode.

Other aspects will become apparent upon reading and understanding accompanying drawings and the detailed description.

BRIEF DESCRIPTION OF DRAWINGS

The attached drawings are used to provide a further understanding of technical solutions of the present disclosure, and constitute a part of the specification. They are used together with embodiments of the present application to explain the technical solutions of the present disclosure, and do not constitute a restriction on the technical solutions of the present disclosure. Shapes and sizes of components in the drawings do not reflect true proportions and only to be used to schematically illustrate contents of the present disclosure.

EXPLANATION OF REFERENCE SIGNS

| | | |
|---|---|---|
| 10-substrate; | 11-light shield layer; | 12-first electrode; |
| 13-first active layer; | 14-first active layer; | 15-second insulating layer; |
| 16-first gate electrode; | 17-second electrode; | 18-first source electrode; |
| 19-first drain electrode; | 20-third insulating layer; | 24-second active layer; |
| 26-second gate electrode; | 28-second source electrode; | 29-second drain electrode; |
| 30- third electrode; | 31-fourth insulating layer; | 32-color filter layer; |
| 33-fifth insulating layer; | 34-third active layer; | 35- fourth electrode; |
| 36-third gate electrode; | 38-third source electrode; | 39-third drain electrode; |
| 40-pixel electrode; | GN-switch scan line; | SN-compensation scan line; |
| LN-connection line; | DN-data line; | SE-compensation line. |

DETAILED DESCRIPTION

Implementations of the present disclosure will be described further in detail below with reference to the accompanying drawings and embodiments. The following embodiments serve to illustrate the present disclosure, but are not intended to limit the scope of the present disclosure. It should be noted that embodiments in the present disclosure and features in the embodiments may be combined with each other arbitrarily if there is no conflict.

In OLED design, pixel aperture ratio is one of parameters, and it is also a factor to improve a resolution of a display apparatus, for example, for bottom emission type OLED. The bottom emission type OLED is to dispose a light-emitting region and a drive circuit region in each sub-pixel, wherein a light-emitting structure is disposed in the light-emitting region, and multiple TFTs and a storage capacitor ($C_{ST}$) are disposed in the drive circuit region in parallel. In order to ensure capacity of the storage capacitor, electrode plates of the storage capacitor usually occupy a larger area. With the development of high-resolution (PPI) display technology, a size of a sub-pixel is getting increasingly smaller, which makes the drive circuit region occupy a larger and larger proportion of pixel area, resulting in a significant decrease in pixel aperture ratio. For example, for a Top Gate bottom emission structure, when the above structure is applied to an ordinary resolution, the pixel aperture ratio is usually about 40%, while when the above structure is applied to high PPI, the pixel aperture ratio is 10% to 20%. Practical application shows that low pixel aperture ratio may cause problems such as increased power consumption and decreased life span of luminescent materials.

Figure 1:
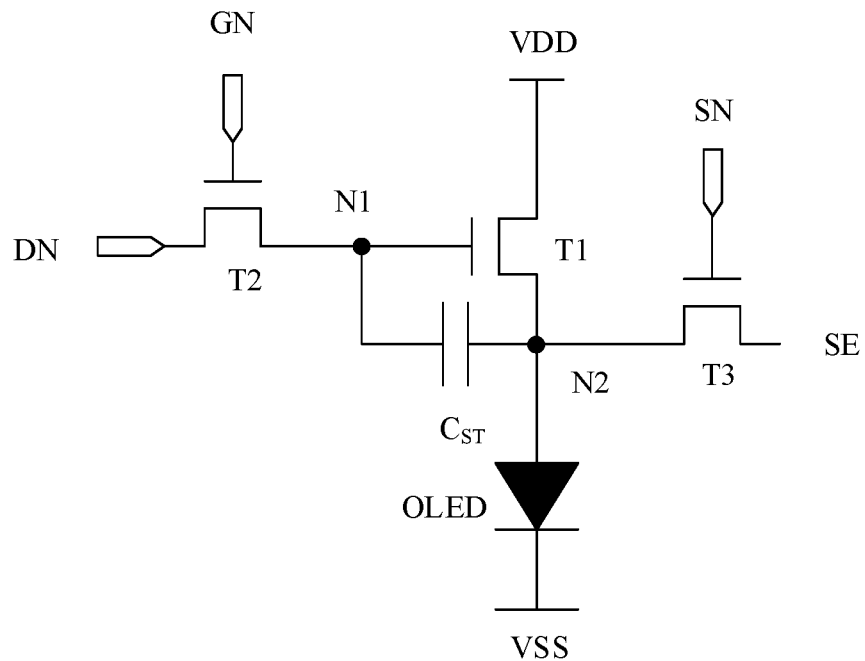
FIG. 1 is a schematic diagram of an equivalent circuit of an OLED pixel drive circuit.

FIG. 1 is a schematic diagram of an equivalent circuit of an OLED pixel drive circuit, illustrating a 3T1C drive structure. As shown in FIG. 1, the pixel drive circuit is electrically connected to a switch scan line GN, a compensation scan line SN, a data line DN, a power supply line VDD and a compensation line SE. The pixel drive circuit may include a first transistor T1, a second transistor T2, a third transistor T3, and a storage capacitor $C_{ST}$. Herein, the first transistor T1 may be a drive transistor, the second transistor T2 may be a switch transistor, and the third transistor T3 may be a compensation transistor.

In an example, a gate electrode of the first transistor T1 is connected to a second electrode of the second transistor T2 and a first electrode of the storage capacitor CST, a first electrode of the first transistor T1 is connected to a first power supply line VDD, and a second electrode of the first transistor T1 is connected to a second electrode of the storage capacitor $C_{ST}$ and a second electrode of the third transistor T3.

In an example, a gate electrode of the second transistor T2 is connected to the scan line GN, and a first electrode of the second transistor T2 is connected to the data line DN; a gate electrode of the third transistor T3 is connected to the compensation scan line SN, and a first electrode of the third transistor T3 is connected to the compensation line SE. An anode of an OLED is connected to a second electrode of the first transistor T1, and a cathode of an OLED is connected to a low voltage line VSS, which is configured to emit light with corresponding brightness in response to a current of the second electrode of the first transistor T1. Herein, the third transistor T3 can extract a threshold voltage Vth and a mobility ratio of the first transistor T1 in response to a compensated timing sequence to compensate the threshold voltage Vth, and the storage capacitor $C_{ST}$ is configured to maintain voltages of node N1 and node N2 in one frame of light emission period, so a higher storage capacity is required.

Figure 2:
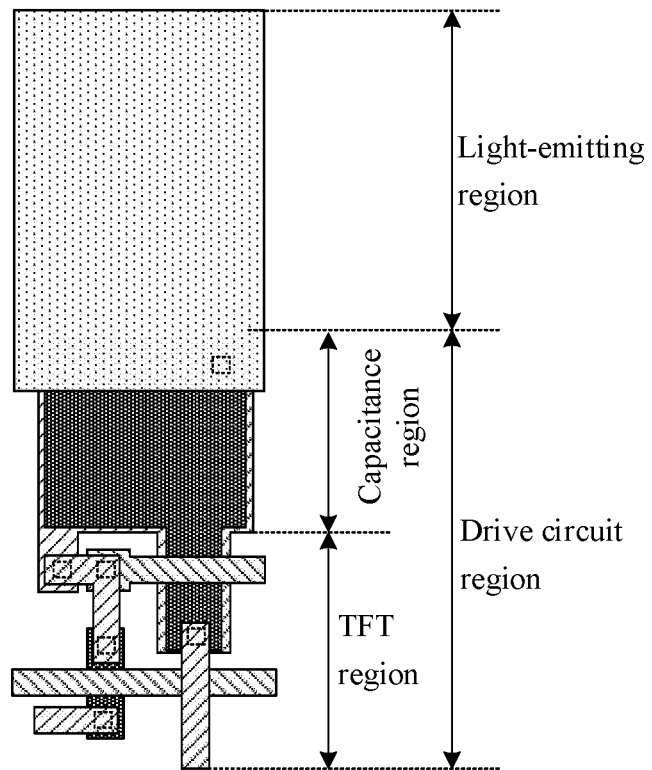
FIG. 2 is a schematic structural diagram of a sub-pixel in a bottom emission type OLED.

FIG. 2 is a schematic structural diagram of a sub-pixel in a bottom emission type OLED. As shown in FIG. 2, each sub-pixel is provided with a light-emitting region and a drive circuit region, wherein the drive circuit region includes a TFT region and a capacitance region, a light-emitting structure is disposed in the light-emitting region, multiple TFTs driving the light-emitting structure are disposed in the TFT region, electrode plates of a storage capacitor are disposed in the capacitance region, and the multiple TFTs and the electrode plates of the storage capacitor are disposed in parallel. In this structure, the storage capacitor is to take a shield layer and a conductive active layer as two electrode plates of the storage capacitor. In order to ensure the capacity of the storage capacitor, the electrode plate needs a larger area, that is, the capacitance region occupies a larger area, so when the above structure is applied to high PPI, the pixel aperture ratio is very low.

In order to effectively improve a pixel aperture ratio of the bottom emission type OLED, an embodiment of the present disclosure provides a display substrate. The display substrate according to the embodiment of the present disclosure includes multiple sub-pixels arranged in a matrix, wherein each sub-pixel is provided with a pixel drive circuit including multiple thin film transistors and a storage capacitor, the storage capacitor of the pixel drive circuit of a present sub-pixel and the storage capacitor of the pixel drive circuit of an adjacent sub-pixel are disposed in a shared capacitance region of the present sub-pixel and the adjacent sub-pixel, and the storage capacitor of the pixel drive circuit of the present sub-pixel and the storage capacitor of the pixel drive circuit of the adjacent sub-pixel are disposed as stacked layers.

Figure 3:
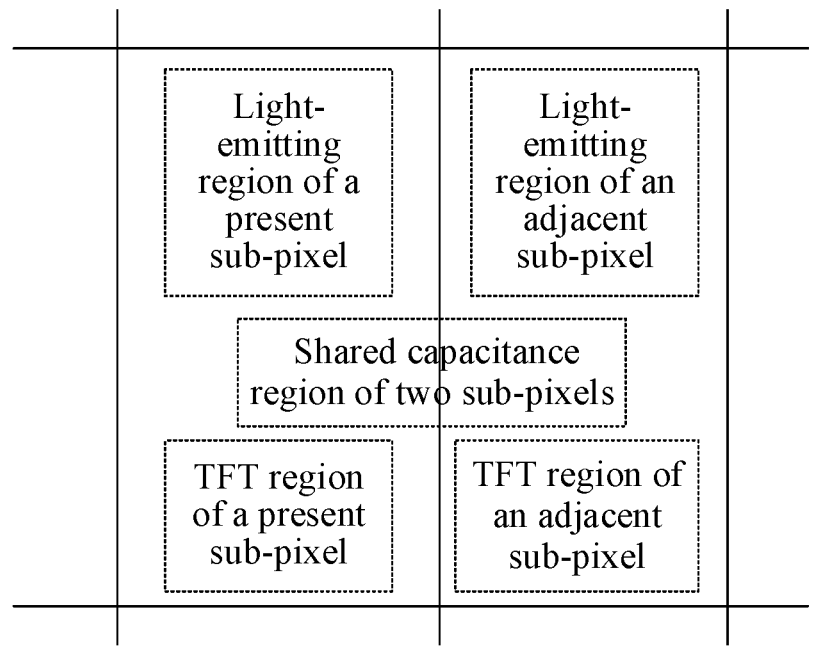
FIG. 3 is a schematic diagram of a capacitance region shared by two sub-pixels on a display substrate according to an embodiment of the present disclosure.
Figure 4:
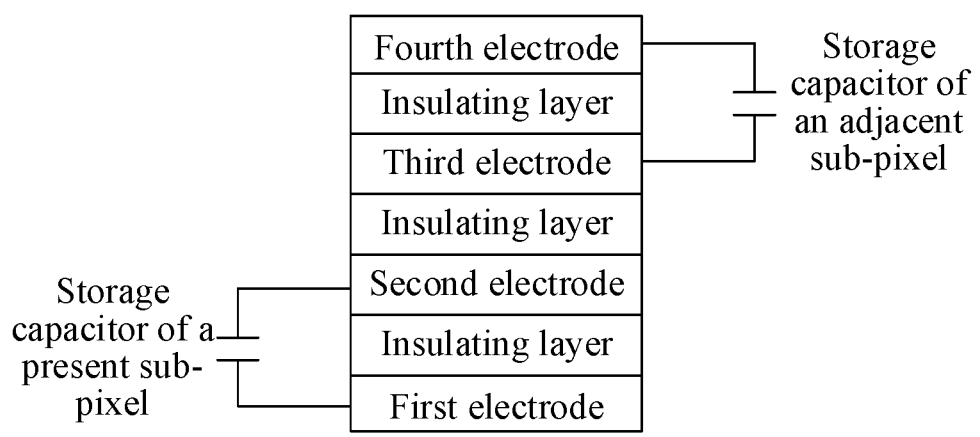
FIG. 4 is a schematic diagram of storage capacitors of two sub-pixels being disposed as stacked layers on a display substrate according to an embodiment of the present disclosure.

FIG. 3 is a schematic diagram of a capacitance region shared by two sub-pixels of a display substrate according to an embodiment of the present disclosure, and FIG. 4 is a schematic diagram of storage capacitors of two sub-pixels disposed as stacked layers on a display substrate according to an embodiment of the present disclosure. As shown in FIG. 3, the two sub-pixels are a present sub-pixel and an adjacent sub-pixel, each sub-pixel is provided with a light-emitting region and a TFT region, and capacitance regions of the two sub-pixels form a shared capacitance region together, and an electrode plate constituting a storage capacitor of each sub-pixel is disposed in the shared capacitance region. As shown in FIG. 4, an electrode plate constituting a storage capacitor of a pixel drive circuit of the present sub-pixel includes a first electrode and a second electrode, wherein the first electrode is disposed in a same layer as a light shield layer, the second electrode is disposed in a same layer as a gate electrode of a thin film transistor, and the first electrode and the second electrode are disposed in the shared capacitance region of the two sub-pixels. An electrode plate constituting a storage capacitor of a pixel drive circuit of an adjacent sub-pixel includes a third electrode and a fourth electrode, wherein the third electrode is disposed in a same layer as source and drain electrodes of the thin film transistor, the fourth electrode is disposed in a same layer as a pixel electrode, and the third electrode and the fourth electrode are disposed in the shared capacitance region of the two sub-pixels.

The embodiment of the present disclosure provides a display substrate, and capacitance region sharing and storage capacitor stacking is realized by using a stacked structure in the display substrate. According to the present disclosure, the capacitance regions of two sub-pixels adjacent to each other are combined together to serve as the shared capacitance region of the two sub-pixels, and the electrode plate constituting the storage capacitor of each sub-pixel is disposed in the shared capacitance region, so that the storage capacitors of the two sub-pixels form a stacked structure, which greatly reduces area of the capacitance region of each sub-pixel, reduces proportion of a pixel area occupied by the drive circuit region, effectively improves pixel aperture ratio, is applicable to high PPI display, and reduces power consumption.

The following elaborately describes the technical solutions of the embodiments of the present disclosure through exemplary embodiments.

Figure 5:
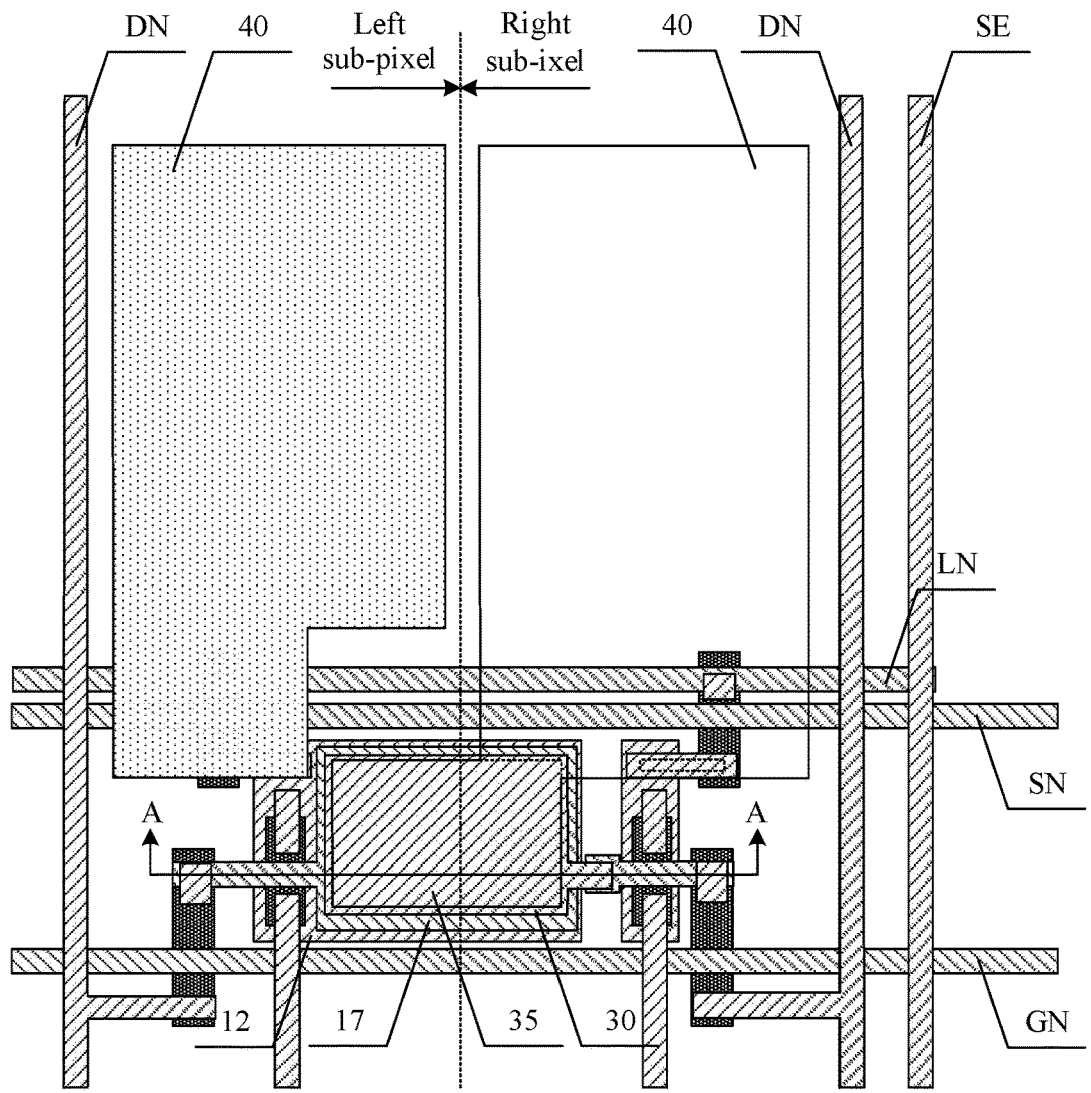
FIG. 5 is a schematic structural diagram of an exemplary embodiment of a display substrate according to the present disclosure.
Figure 6:
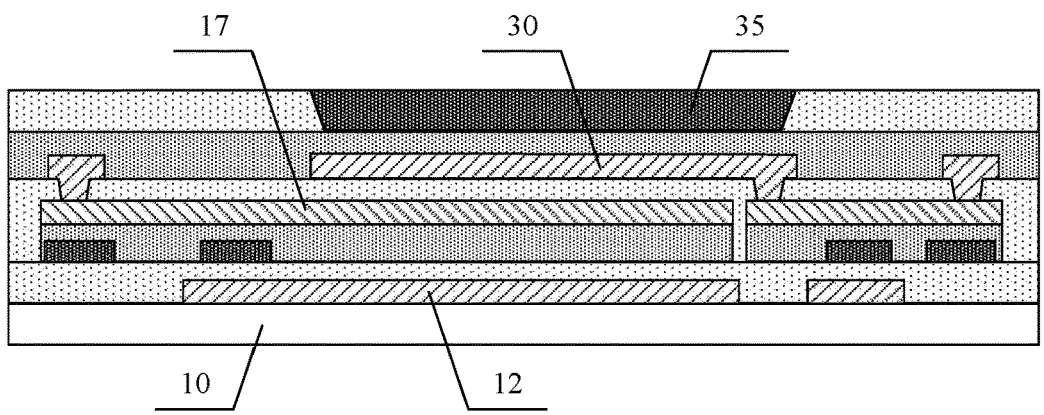
FIG. 6 is a sectional view of FIG. 5 in an A-A direction.

FIG. 5 is a structural schematic diagram of an exemplary embodiment of a display substrate of the present disclosure, and FIG. 6 is a sectional view taken along an A-A direction in FIG. 5, illustrating a structure of two sub-pixels of a bottom emission display substrate which are adjacent to each other. In actual practice, two sub-pixels adjacent to each other may be a red sub-pixel and a green sub-pixel, or a blue sub-pixel and a green sub-pixel, or a red sub-pixel and a blue sub-pixel. In the present embodiment, a left sub-pixel in FIG. 5 refers to the present sub-pixel, and a right sub-pixel in FIG. 5 refers to the adjacent sub-pixel. As shown in FIGS. 5 and 6, combined with FIGS. 7 to 20, the display substrate provided in the present embodiment may include: a base substrate 10; a light shield layer 11 and a first electrode 12, which are disposed on the base substrate 10; wherein the first electrode 12 is disposed in a shared capacitance region of two sub-pixels, each sub-pixel is provided with a light shield layer 11, the light shield layer 11 of the left sub-pixel is connected to the first electrode 12 and is an integrated structure together with the first electrode 12, and the light shield layer 11 of the right sub-pixel is separately disposed;

a first insulating layer 13, which covers the light shield layer 11 and the first electrode 12; a first active layer 14, a second active layer 24, and a third active layer 34, which are disposed on the first insulating layer 13; wherein each of the two sub-pixels is provided with a first active layer 14, a second active layer 24 and a third active layer 34; a second insulating layer 15, and a switch scan line GN, a compensation scan line SN, a connection line LN, a first gate electrode 16, a second gate electrode 26, a third gate electrode 36 and a second electrode 17 which are disposed on the second insulating layer 15 and have a same pattern with the second insulating layer 15; wherein, the second electrode 17 is disposed in the shared capacitance region of the two sub-pixels, each of the two sub-pixels is provided with a first gate electrode 16, a second gate electrode 26 and a third gate electrode 36; the second gate electrodes 26 of the two sub-pixels and the switch scan line GN are an integrated structure, the third gate electrodes 36 and the compensation scan line SN are an integrated structure, the first gate electrode 16 of the left sub-pixel is connected to the second electrode 17 and is an integrated structure together with the second electrode 17, and the first gate electrode 16 of the right sub-pixel is separately disposed; a third insulating layer 20, which covers the switch scan line GN, the compensation scan line SN, the connection line LN, the first gate electrode 16, the second gate electrode 26, the third gate electrode 36 and the second electrode 17, and is respectively opened with multiple via holes thereon, wherein the multiple via holes include first via holes V1 in the two sub-pixels simultaneously exposing the first gate electrodes 16 and the second active layers 24, a second via hole V2 in the right sub-pixel exposing the first gate electrode 16, third via holes V3 and fourth via holes V4 in the two sub-pixels exposing two ends of the first active layers 14, fifth via holes V5 in the two sub-pixels exposing the second active layers 24, sixth via holes V6 in the two sub-pixels simultaneously exposing the connection line LN and the third active layers 34, seventh via holes V7 in the two sub-pixels exposing the third active layers 34, eighth via holes V8 and ninth via holes V9 in the two sub-pixels exposing the light shield layers 11, a tenth via hole V10 in the right sub-pixel exposing the connection line LN, wherein, both the first via hole V1 and the sixth via hole V6 are dual connection holes, and the first via hole V1 simultaneously exposes the first gate electrode 16 and the second active layer 24, and the sixth via hole V6 simultaneously exposes the connection line LN and the third active layer 34; a data line DN, a compensation line SE, a first source electrode 18, a first drain electrode 19, a second source electrode 28, a second drain electrode 29, a third source electrode 38, a third drain electrode 39 and a third electrode 30, which are disposed on the third insulating layer 20, wherein the first source electrodes 18 of the two sub-pixels are connected to the first active layers 14 through the fourth via holes V4, and the first drain electrodes 19 are connected to the first active layers 14 through the third via holes V3, and are simultaneously connected to the light shield layers 11 through the ninth via holes V9; the second source electrodes 28 in the two sub-pixels and the data line DN are an integrated structure, and are connected to the second active layers 24 through the fifth via holes V5, and the second drain electrodes 29 are simultaneously connected to the second active layers 24 and the first gate electrodes 16 through the first via holes V1; the third source electrodes 38 in the two sub-pixels are simultaneously connected to the connection line LN and the third active layers 34 through the sixth via holes V6, and the third drain electrodes 39 are connected to the third active layers 34 through the seventh via holes V7 and are meanwhile connected to the light shield layers 11 through the eighth via holes V8; the third electrode 30 is disposed in the shared capacitance region of the two sub-pixels and connected to the first gate electrode 16 of the right sub-pixel through the second via hole V2; the compensation line SE is connected to the connection line LN through the tenth via hole V10; a fourth insulating layer 31 and a fifth insulating layer 33, which cover the aforementioned structure, and form an eleventh via hole V11 and a twelfth via hole V12 thereon, wherein the eleventh via holes V11 are located at positions of third drain electrodes 39 in the two sub-pixels and expose surfaces of the third drain electrodes 39, and the twelfth via hole V12 is located at a position of the third electrode 30 and exposes a surface of the fourth insulating layer 31; a pixel electrode 40 and a fourth electrode 35, which are disposed on the fifth insulating layer 33, wherein, the pixel electrodes 40 of the two sub-pixels are connected to the third drain electrodes 39 through the eleventh via holes V11, and the fourth electrode 35 is disposed in the shared capacitance region of the two sub-pixels and in the twelfth via hole V12, and is an integrated structure together with the pixel electrode 40 of the right sub-pixel.

In the present embodiment, the first electrode and the second electrode are disposed in the shared capacitance region of the two sub-pixels to form the storage capacitor of the left sub-pixel, and the third electrode and the fourth electrode are disposed in the shared capacitance region of the two sub-pixels to form the storage capacitor of the right sub-pixel, wherein, the storage capacitor of the left sub-pixel is below the storage capacitor of the right sub-pixel, so that the storage capacitor of the left sub-pixel and the storage capacitor of the right sub-pixel are disposed in a stacked structure.

The technical solution of the present embodiment is further described below through a process for preparing the display substrate in the present embodiment. "The patterning process" mentioned in the present embodiment, including processing such as deposition of a film layer, coating of photoresist, mask exposure, development, etching, stripping of photoresist, etc., are some preparation processes. A process such as sputtering, evaporation or chemical vapor deposition may be used for deposition, and a coating process may be used for coating, which is not limited here. In the description of the present embodiment, it should be understood that "thin film" refers to a layer of thin film made of a certain material by deposition or another process on the base substrate. If the "thin film" does not need a patterning process during the whole manufacturing process, the "thin film" may also be called a "layer". If the "thin film" also needs a patterning process during the whole manufacturing process, it is called "thin film" before the patterning process and "layer" after the patterning process. The "layer" after the patterning process contains at least one "pattern".

Figure 7:
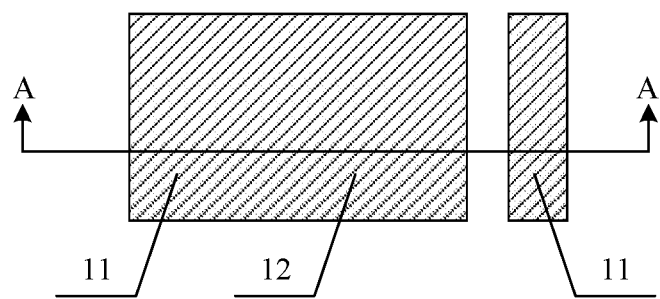
FIG. 7 is a schematic diagram after patterns of a light shield layer and a first electrode are formed according to the embodiment of the present disclosure shown in FIG. 5.
Figure 8:
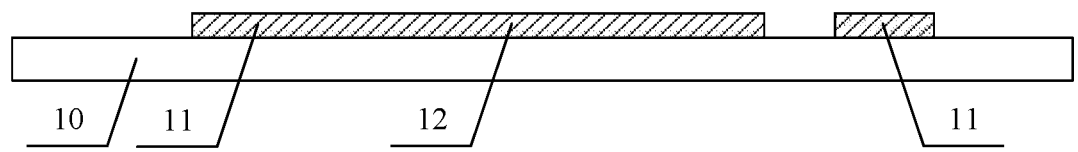
FIG. 8 is a sectional view of FIG. 7 in an A-A direction.

(1) A pattern of a light shield layer and a pattern of a first electrode are formed. Forming a pattern of a light shield layer and a pattern of a first electrode pattern includes: depositing a first metal thin film on a base substrate, patterning the first metal thin film by a patterning process, and forming the pattern of the light shield layer 11 and the pattern of the first electrode 12 on the base substrate 10, as shown in FIGS. 7 and 8, and FIG. 8 is a sectional view taken along an A-A direction in FIG. 7. In the present embodiment, each sub-pixel is provided with the light shield layer 11, and the first electrode 12 is disposed in a shared capacitance region of two sub-pixels, that is, the first electrode 12 is disposed between the two light shield layers 11, and the light shield layer 11 of a left sub-pixel is connected to the first electrode 12 to be an integrated structure. Although the first electrode 12 in the present embodiment is a bottom electrode plate for forming a storage capacitor of the left sub-pixel, it is disposed in the shared capacitance region of the two sub-pixels, that is, the first electrode 12 occupies the capacitance region of the left sub-pixel and the capacitance region of the right sub-pixel. For simplicity, the storage capacitor of the left sub-pixel is referred to as a first storage capacitor. Herein, the first metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

Figure 9:
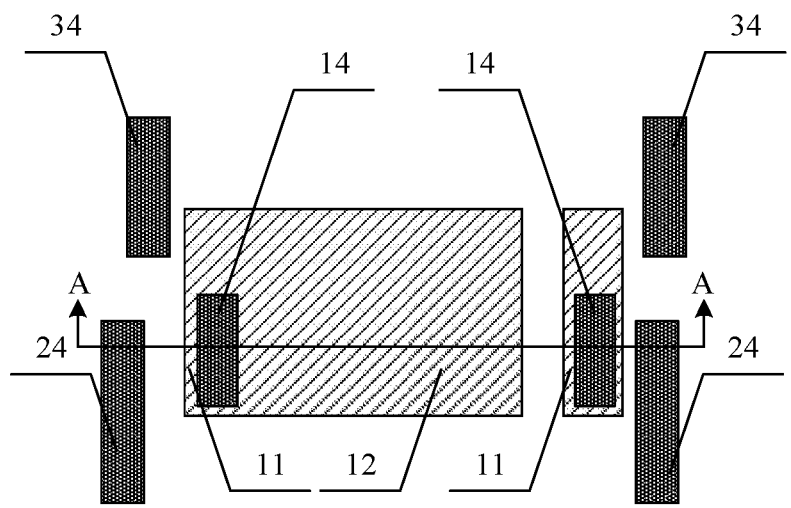
FIG. 9 is a schematic diagram after a pattern of an active layer is formed according to the embodiment of the present disclosure shown in FIG. 5.
Figure 10:
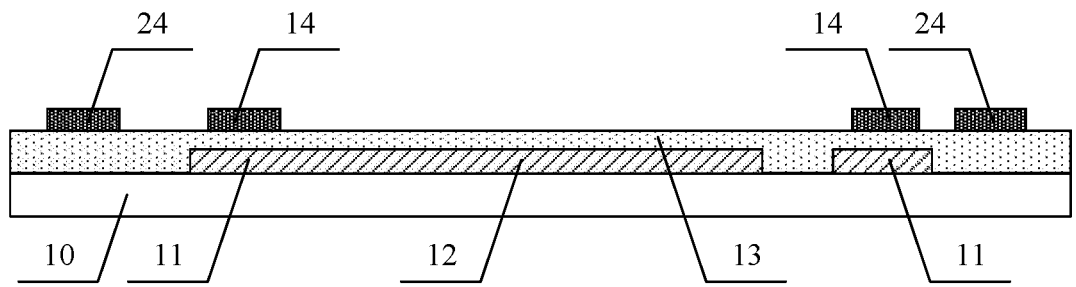
FIG. 10 is a sectional view of FIG. 9 in an A-A direction.

(2) A pattern of an active layer is formed. Forming a pattern of an active layer includes: depositing a first insulating thin film and an Active thin film sequentially on the base substrate on which the above patterns are formed, patterning the Active thin film by a patterning process to form a first insulating layer 13 covering the pattern of the light shield layer 11 and the pattern of the first electrode 12, and forming patterns of a first active layer 14, a second active layer 24 and a third active layer 34 on the first insulating layer 13, as shown in FIGS. 9 and 10, wherein FIG. 10 is a sectional view of FIG. 9 in an A-A direction. Herein, a first active layer 14, a second active layer 24 and a third active layer 34 are formed in each of the two sub-pixels, wherein the first active layer 14 serves as an active layer of a drive TFT (a first transistor T1), the second active layer 24 serves as an active layer of a switch TFT (a second transistor T2) and the third active layer 34 serves as an active layer of a compensation TFT (a third transistor T3). The active layer thin film may be made of multiple kinds of materials such as amorphous indium gallium zinc Oxide (a-IGZO), zinc oxynitride (ZnON), indium zinc tin oxide (IZTO), amorphous silicon (a-Si), polysilicon (p-Si), sexithiophene or polythiophene, that is, the present embodiment is simultaneously applicable to a Top Gate TFT-based display substrate manufactured based on an Oxide technology, a silicon technology and an organic technology. The first insulating thin film may be made of silicon oxide (SiOx), silicon nitride (SiNx), silicon oxynitride (SiON), etc., or a material of high dielectric constant High k such as aluminum oxide (AlOx), hafnium oxide (HfOx), tantalum oxide (TaOx), etc., and may be a single layer, multiple layers, or a composite layer. Generally, the first insulating layer 13 is referred to as a Buffer layer.

Figure 11:
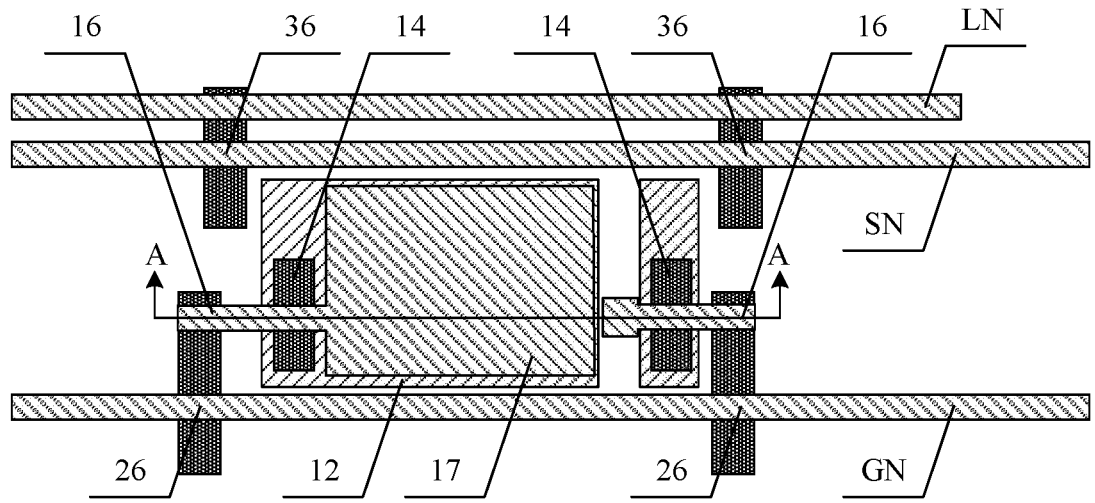
FIG. 11 is a schematic diagram after patterns of a gate electrode and a second electrode are formed according to the embodiment of the present disclosure shown in FIG. 5.
Figure 12:
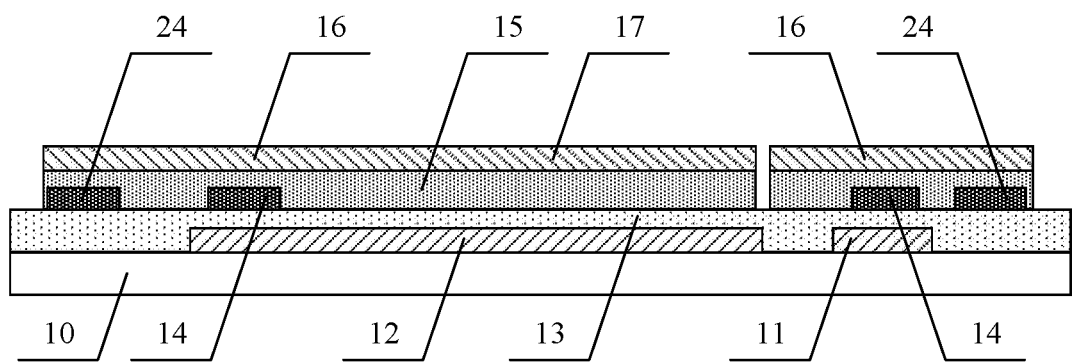
FIG. 12 is a sectional view of FIG. 11 in an A-A direction.

(3) A pattern of a gate electrode and a pattern of a second electrode are formed. Forming a pattern of a gate electrode and a pattern of a second electrode includes: depositing a second insulating thin film and a second metal thin film in sequence on the base substrate where the above patterns are formed; and first coating a layer of photoresist on the second metal thin film, forming a photoresist pattern through mask, exposure and development, and etching the second metal thin film by an etching process, and then downwards etching the second insulating thin film by self-alignment using the second metal thin film as a mask to form a pattern of a second insulating layer 15 and the patterns of a switch scan line GN, a compensation scan line SN, a connection line LN, a first gate electrode 16, a second gate electrode 26, a third gate electrode 36 and a second electrode 17 disposed on the second insulating layer 15, as shown in FIGS. 11 and 12, wherein FIG. 12 is a sectional view of FIG. 11 in an A-A direction. Subsequently, conductive processing of the exposed first active layer 14, second active layer 24, and third active layer 34 are performed by taking the patterns of the scan line and the gate electrode as masks. In the present embodiment, the second electrode 17 is disposed in the shared capacitance region of the two sub-pixels and between the first gate electrodes 16 of the two sub-pixels, a position of the second electrode 17 corresponds to a position of the first electrode 12, that is, an orthographic projection of the second electrode 17 on the base substrate is within a range of an orthographic projection of the first electrode 12 on the base substrate. A first gate electrode 16, a second gate electrode 26 and a third gate electrode 36 are disposed in each of the two sub-pixels. The second gate electrodes 26 of the two sub-pixels are an integrated structure connected to the switch scan line GN, and the third gate electrodes 36 of the two sub-pixels are an integrated structure connected to the compensation scan line SN. The first gate electrode 16 and the second electrode 17 in the left sub-pixel are connected into be an integrated structure. Although the second electrode 17 in the present embodiment is an upper electrode plate for forming the storage capacitor of the left sub-pixel, it is disposed in the shared capacitance region of the two sub-pixels, that is, the second electrode 17 occupies the capacitance region of the left sub-pixel and the capacitance region of the right sub-pixel. The switch scan line GN is configured to provide on/off signals for controlling a switch TFT to the second gate electrodes 26 of the two sub-pixels, the compensation scan line SN is configured to provide on/off signals for controlling a compensating TFT to the third gate electrodes 36 of the two sub-pixels, and the connection line LN serves as a source electrode of the compensating TFT in the two sub-pixels, and will be connected to the compensation line SE subsequently formed. The shared capacitance region of the two sub-pixels is disposed between the switch scan line GN and the compensation scan line SN. Herein, the second metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO). The second insulating thin film may be made of silicon oxide (SiOx), silicon nitride (SiNx), silicon oxynitride (SiON), etc., or a material of High k such as aluminum oxide (AlOx), hafnium oxide (HfOx), tantalum oxide (TaOx), etc., and may be a single layer, multiple layers, or a composite layer. Generally, the second insulating layer 15 is called a gate insulating (GI) layer.

Figure 13:
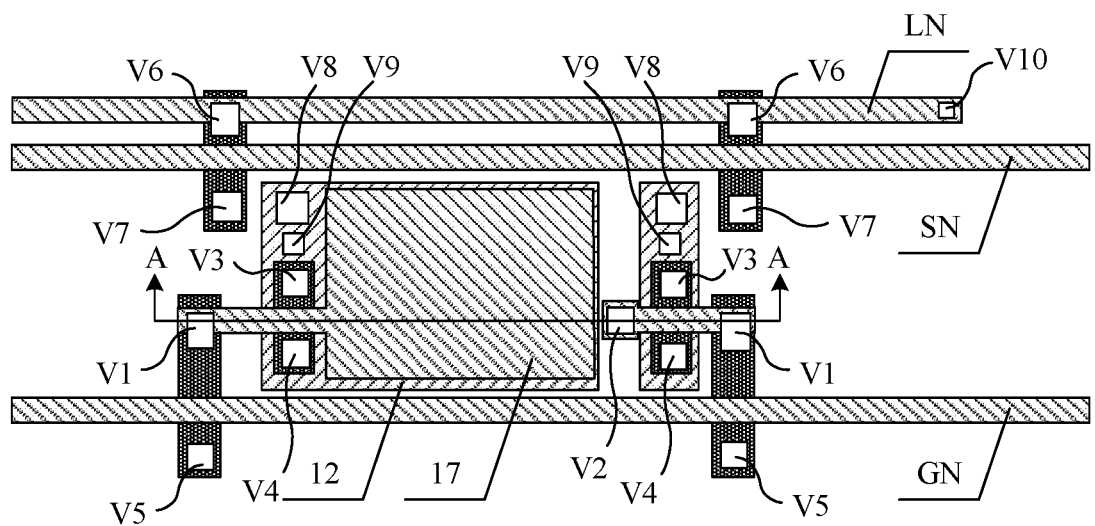
FIG. 13 is a schematic diagram after a pattern of a third insulating layer is formed according to the embodiment of the present disclosure shown in FIG. 5.
Figure 14:
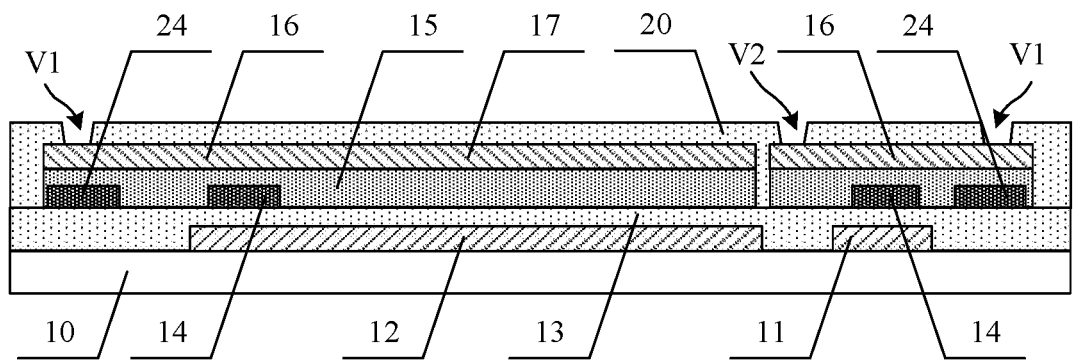
FIG. 14 is a sectional view of FIG. 13 in an A-A direction.

(4) A pattern of a third insulating layer is formed. Forming a pattern of a third insulating layer includes: depositing a third insulating thin film on the base substrate where the above patterns are formed, patterning the third insulating thin film by a patterning process to form the pattern of the third insulating layer 20 covering the above structure, wherein the third insulating layer 20 is opened with multiple via holes, which are respectively, first via holes V1 formed in the two sub-pixels and simultaneously exposing the first gate electrode 16 and the second active layer 24, a second via hole V2 formed in the right sub-pixel and exposing the first gate electrode 16, third via holes V3 and fourth via holes V4 formed in the two sub-pixels and exposing two ends of the first active layers 14, fifth via holes V5 formed in the two sub-pixels and exposing the second active layers 24, sixth via holes V6 formed in the two sub-pixels and simultaneously exposing the connection line LN and the third active layers 34, seventh via holes V7 formed in the two sub-pixels exposing the third active layers 34, eighth via holes V8 and ninth via holes V9 formed in the two sub-pixels and exposing the light shield layers 11, a tenth via hole V10 formed in the right sub-pixel and exposing the connection line LN, as shown in FIGS. 13 and 14, wherein FIG. 14 is a sectional view taken along an A-A direction in FIG. 13. Herein, the first via holes V1 formed in the two sub-pixels are transfer via holes simultaneously exposing the first gate electrode 16 and the second active layer 24, and the transfer via hole is composed of two half holes, one half hole exposing the first gate electrode 16 and the other half hole exposing the second active layer 24. The sixth via holes V6 of the two sub-pixels are transfer via holes simultaneously exposing the connection line LN and the third active layer 34, wherein one half hole exposes the connection line LN and the other half hole exposes the third active layer 34. The first via hole V1 and the sixth via hole V6 disposed as transit via holes may reduce an occupied area of the drive circuit region and improve an aperture ratio. Herein, the third insulating layer may be made of silicon oxide (SiOx), silicon nitride (SiNx), silicon oxynitride (SiON), etc., or a material of High k such as aluminum oxide (AlOx), hafnium oxide (HfOx), tantalum oxide (TaOx), etc., and may be a single layer, multiple layers, or a composite layer. Generally, the third insulating layer 20 is referred to as an interlayer insulating (ILD) layer.

Figure 15:
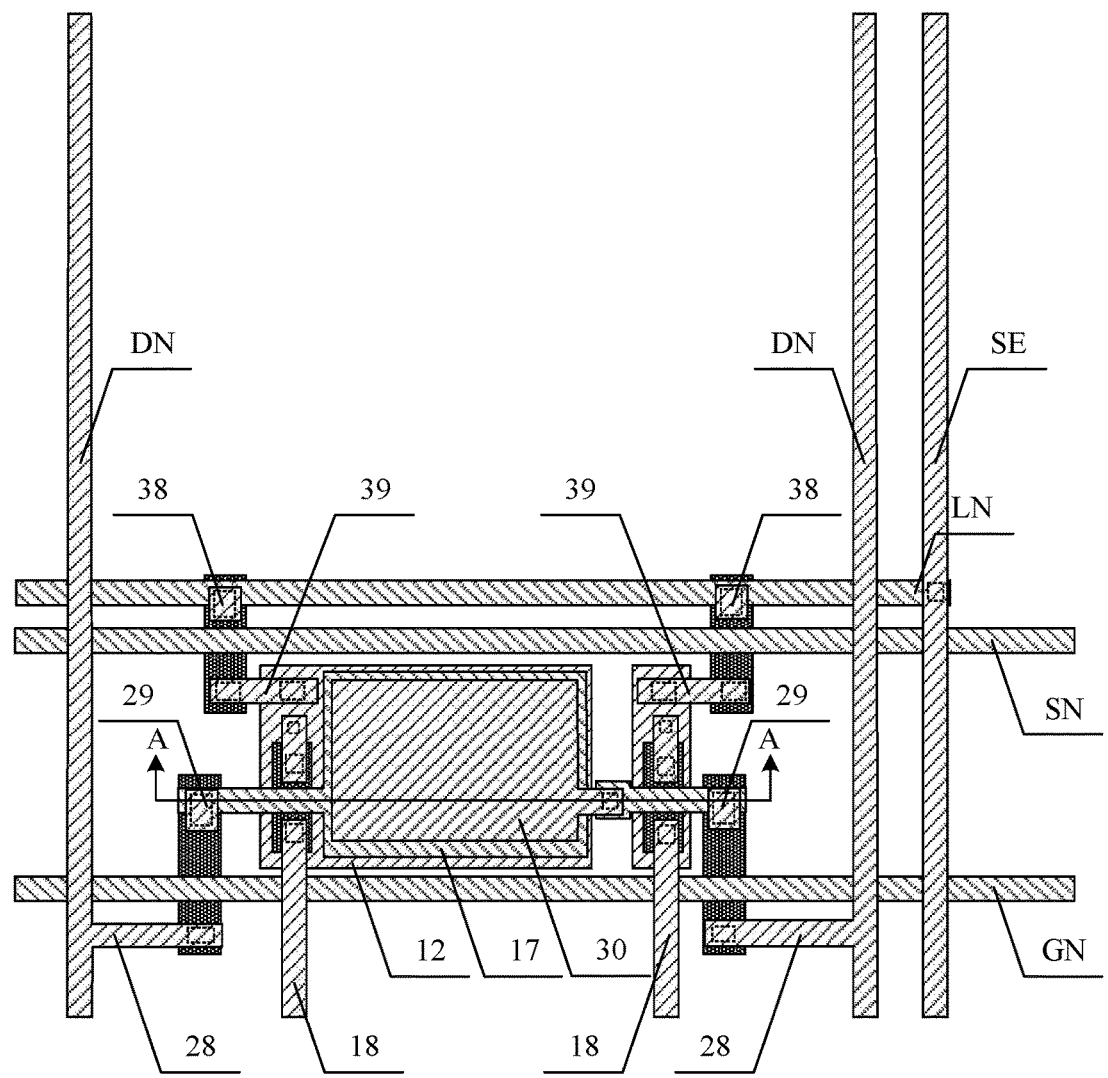
FIG. 15 is a schematic diagram after patterns of source and drain electrodes and a third electrode are formed according to the embodiment of the present disclosure shown in FIG. 5.
Figure 16:
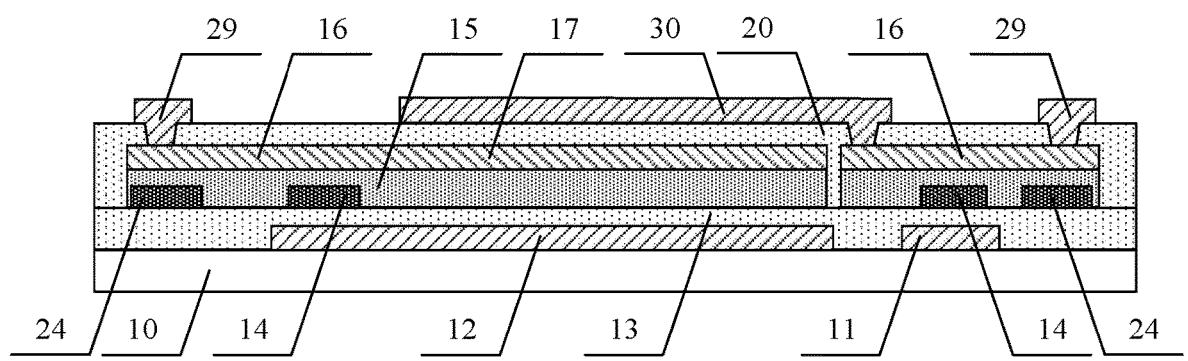
FIG. 16 is a sectional view of FIG. 15 in an A-A direction.

(5) Patterns of source and drain electrodes and a pattern of a third electrode are formed. Forming patterns of source and drain electrodes and a pattern of a third electrode includes: depositing a third metal thin film on the base substrate where the above patterns are formed, patterning the third metal thin film by a patterning process, and forming patterns of a power supply line (not shown), a data line DN, a compensation line SE, a first source electrode 18, a first drain electrode 19, a second source electrode 28, a second drain electrode 29, a third source electrode 38 and a third drain electrode 39 and a third electrode 30 on the third insulating layer 20, as shown in FIGS. 15 and 16, wherein FIG. 16 is a sectional view taken along an A-A direction in FIG. 15. In which is following.

The data lines DN are disposed outside the two sub-pixels so that the shared capacitance region of the two sub-pixels is located between the two data lines DN, each data line DN provides a data signal for the switch TFT of a sub-pixel adjacent thereto, and the compensation line SE is disposed outside the data line DN and connected to the connection line LN through the tenth via hole V10 to provide compensation signals for the compensation TFTs of the two sub-pixels between the two data lines DN.

In the two sub-pixels, the first source electrodes 18 are an integrated structure connected to a power supply line (not shown); the first source electrode 18 of each sub-pixel is connected to an end of the first active layer 14 of the sub-pixel through the fourth via hole V4, and the first drain electrode 19 of each sub-pixel is connected to the other end of the first active layer 14 of the sub-pixel through the third via hole V3 on one hand and is connected to the light shield layer 11 of the sub-pixel through the ninth via hole V9 on the other hand. Since the light shield layer 11 of the left sub-pixel is an integrated structure connected to the first electrode 12, it is thus equivalent to that the first drain electrode 19 of the left sub-pixel is connected to the first electrode 12, that is, the first drain electrode 19 of the left sub-pixel is connected to the lower electrode plate forming the first storage capacitor, and potentials of the first drain electrode 19 and the first electrode 12 in the left sub-pixel are same.

The second source electrode 28 of each sub-pixel is an integrated structure connected to the data line DN of the sub-pixel; the second source electrode 28 of each sub-pixel is connected to one end of the second active layer 24 of the sub-pixel through the fifth via hole V5; and the second drain electrode 29 of each sub-pixel is, through the first via hole V1, connected to the other end of the second active layer 24 of the sub-pixel on one hand and is connected to the first gate electrode 16 of the sub-pixel on the other hand, that is, the second drain electrode 29 is simultaneously connected to the second active layer 24 and the first gate electrode 16 through the first via hole V1. Since the first gate electrode 16 of the left sub-pixel is an integrated structure connected to the second electrode 17, it is thus equivalent to that the second drain electrode 29 of the left sub-pixel is connected to the second electrode 17, that is, the second drain electrode 29 of the left sub-pixel is connected to the upper electrode plate forming the first storage capacitor, and potentials of the first gate electrode 16, the second drain electrode 29 and the second electrode 17 of the left sub-pixel are same.

The third source electrode 38 of each sub-pixel is, through the sixth via hole V6, connected to the connection line LN on one hand and is connected to an end of the third active layer 34 of the sub-pixel on the other hand, and the third drain electrode 39 of each sub-pixel is connected to the other end of the third active layer 34 of the sub-pixel through the seventh via hole V7 on one hand and is connected to the light shield layer 11 of the sub-pixel through the eighth via hole V8 on the other hand. Since the third source electrode 38 is connected to the connection line LN and the connection line LN is connected to the compensation line SE, a compensation signal of the compensation line SE is applied to the third source electrode 38. Since the third drain electrode 39 of the left sub-pixel is connected to the light shield layer 11, and the light shield layer 11 is an integrated structure connected to the first electrode 12, it is thus equivalent to that the third drain electrode 39 of the left sub-pixel is connected to the first electrode 12, that is the third drain electrode 39 of the left sub-pixel is connected to the lower electrode plate forming the first storage capacitor, and potentials of the first drain electrode 19 of the left sub-pixel, the third drain electrode 39 and the first electrode 12 of the left sub-pixel are same.

A main part of the third electrode 30 is disposed in the shared capacitance region of the two sub-pixels, and a position thereof corresponds to a position of the second electrode 17, that is, an orthographic projection of the main part of the third electrode 30 on the base substrate is within a range of an orthographic projection of the second electrode 17 on the base substrate. The protruding part on the right side of the third electrode 30 is connected to the first gate electrode 16 of the right sub-pixel through the second via hole V2. Since in the right sub-pixel, the first gate electrode 16 is connected to the second drain electrode 29, it is thus equivalent to that the third electrode 30 is connected to the second drain electrode 29 of the right sub-pixel, and potentials of the first gate electrode 16 of the right sub-pixel, the second drain electrode 29 of the right sub-pixel and the third electrode 30 are same. Although the third electrode 30 in the present embodiment is a lower electrode plate for forming the storage capacitor of the right sub-pixel, it is disposed in the shared capacitance region of the two sub-pixels, that is, the third electrode 30 occupies the capacitance region of the right sub-pixel and the capacitance region of the left subpixel. For simplicity, the storage capacitor of the right sub-pixel is referred to as a second storage capacitor.

Figure 17:
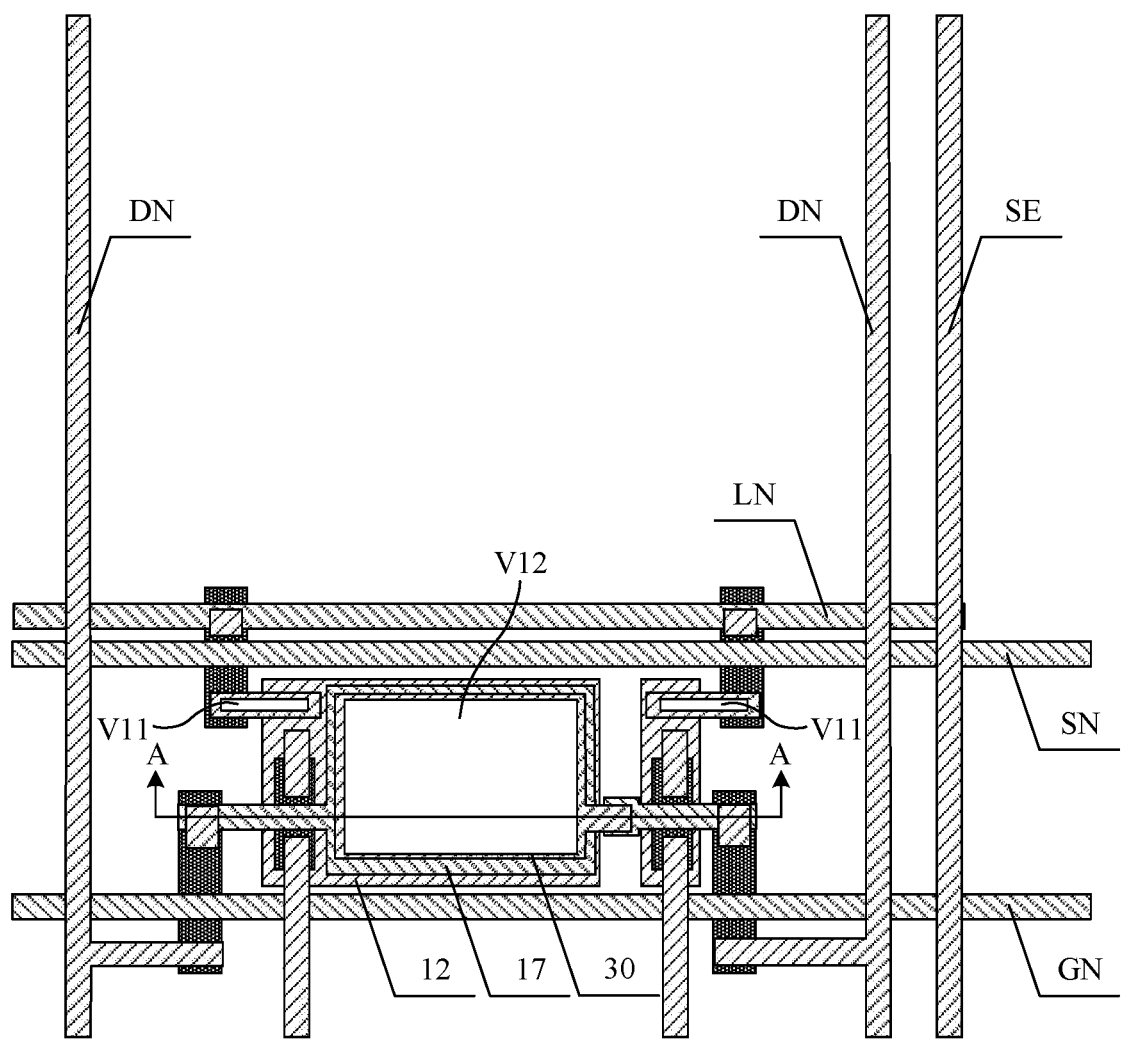
FIG. 17 is a schematic diagram after a pattern of a fifth insulating layer is formed according to the embodiment of the present disclosure shown in FIG. 5.
Figure 18:
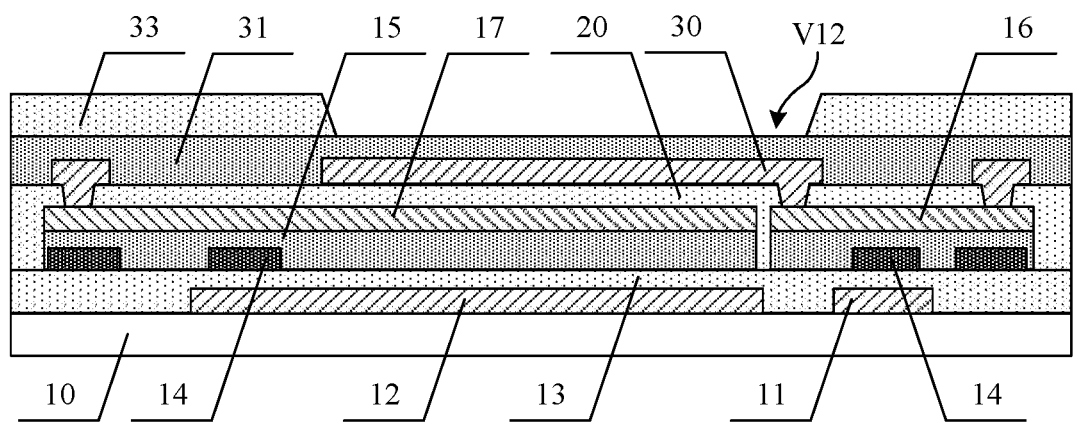
FIG. 18 is a sectional view of FIG. 17 in an A-A direction.

(6) Patterns of a fourth insulating layer and a fifth insulating layer are formed. Forming patterns of a fourth insulating layer and a fifth insulating layer pattern includes: first depositing, on the base substrate where the above patterns are formed, the fourth insulating thin film to form a fourth insulating layer 31 covering the aforementioned structure, then coating the fifth insulating thin film, and etching, by using the fifth insulating thin film as photoresist, the fourth insulating layer 31 by mask, exposure and development to form a pattern of a fifth insulating layer 33 covering the aforementioned structure, an eleventh via hole V11 and a twelfth via hole V12 being formed on the fifth insulating layer 33, wherein the eleventh via holes V11 are respectively located at positions of the third drain electrodes 39 in the two sub-pixels, and the fifth insulating layer 33 and the fourth insulating layer 31 in the two eleventh via holes V11 are removed to expose a surface of the third drain electrode 39. The twelfth via hole V12 is located at the position of the third electrode 30, and the fifth insulating layer 33 in the twelfth via hole V12 is removed to expose a surface of the fourth insulating layer 31, as shown in FIG. 17 and FIG. 18, wherein FIG. 18 is a sectional view taken along an A-A direction in FIG. 17. Herein, the fourth insulating thin film may be made of silicon oxide (SiOx), silicon nitride (SiNx), silicon oxynitride (SiON), etc., or a material of High k such as aluminum oxide (AlOx), hafnium oxide (HfOx), tantalum oxide (TaOx), etc., and may be a single layer, multiple layers, or a composite layer. A material of the fifth insulating thin film includes, but is not limited to, polysiloxane-based materials, acrylic-based materials, or polyimide-based materials, or the like. Generally, the fourth insulating layer 31 is referred to as a passivation (PVX) layer, and the fifth insulating layer 33 is referred to as a planarization (PNL) layer.

Figure 19:
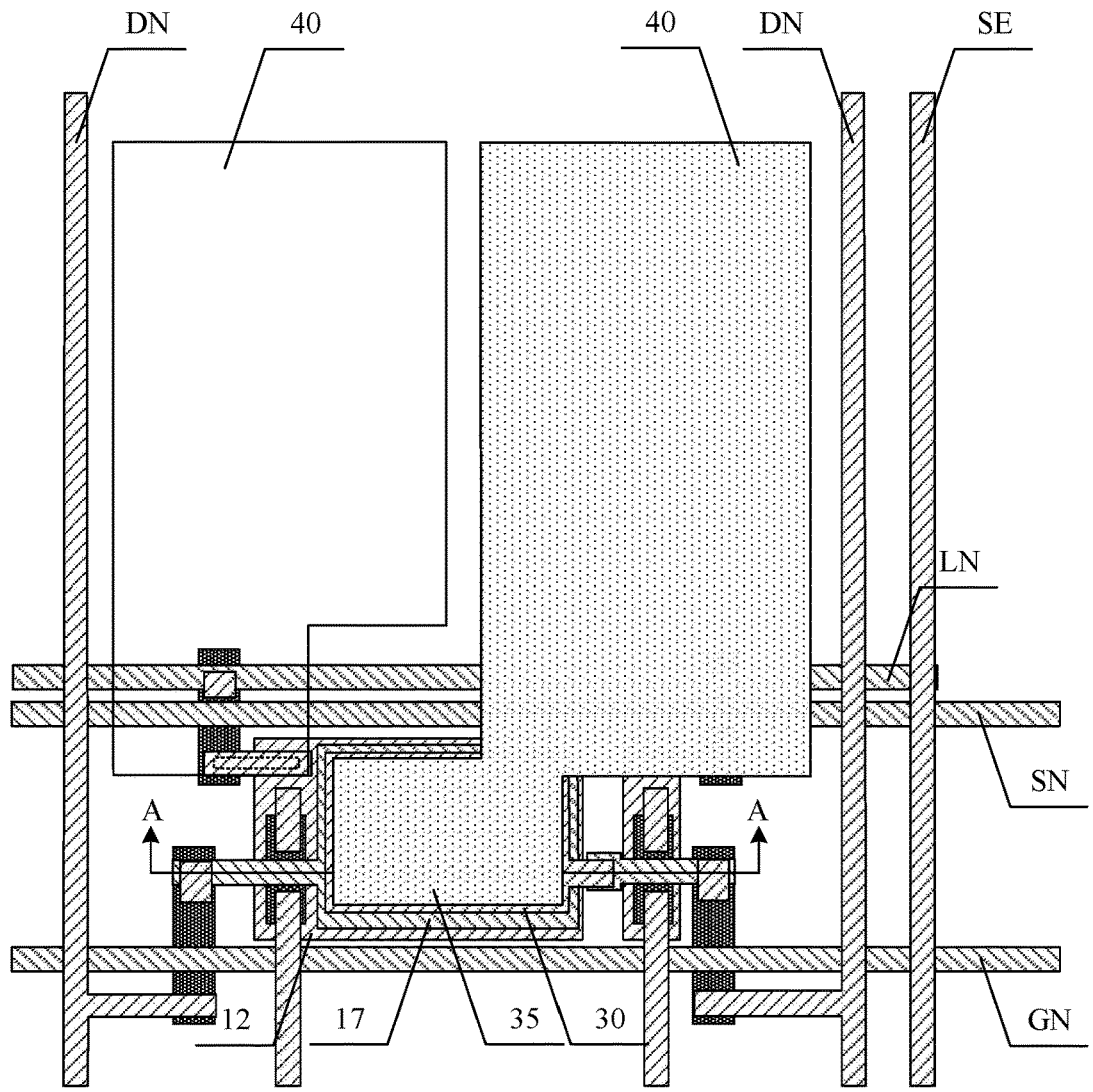
FIG. 19 is a schematic diagram after patterns of a pixel electrode and a fourth electrode are formed according to the embodiment of the present disclosure shown in FIG. 5.
Figure 20:
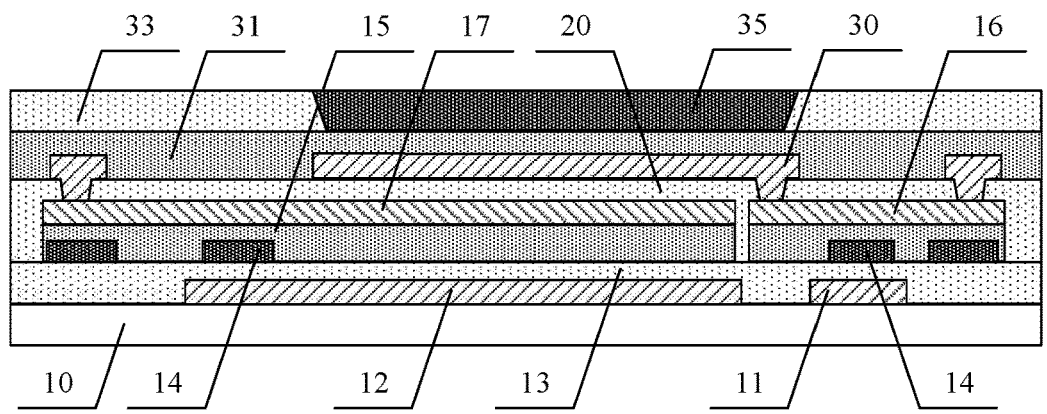
FIG. 20 is a sectional view of FIG. 19 in an A-A direction.

(7) Patterns of a pixel electrode and a fourth electrode are formed. Forming patterns of a pixel electrode and a fourth electrode includes: depositing a transparent conductive thin film on the base substrate where the aforementioned patterns are formed, patterning the transparent conductive thin film by a patterning process to form patterns of a pixel electrode 40 and a fourth electrode 35, wherein the pixel electrode 40 of the left sub-pixel is connected to the third drain electrode 39 of the left sub-pixel through an eleventh via hole V11, the pixel electrode 40 of the right sub-pixel is connected to the third drain electrode 39 of the right sub-pixel through an eleventh via hole V11, and the fourth electrode 35 is formed in the twelfth via hole V12, and is an integrated structure connected to the pixel electrode 40 of the right sub-pixel, as shown in FIGS. 19 and 20, wherein FIG. 20 is a cross-sectional view taken along an A-A direction in FIG. 19. Herein, the transparent conductive thin film may be made of indium tin oxide (ITO) or indium zinc oxide (IZO), etc.

In the present embodiment, the fourth electrode 35 is disposed in the shared capacitance region of the two sub-pixels, and a position thereof corresponds to the position of the third electrode 30, that is, an orthographic projection of the fourth electrode 35 on the base substrate is within a range of an orthographic projection of the third electrode 30 on the base substrate. Although the fourth electrode 35 in the present embodiment is an upper electrode plate for forming the storage capacitor of the right sub-pixel, it is disposed in the shared capacitance region of the two sub-pixels, that is, the fourth electrode 35 occupies the capacitance region of the right sub-pixel and the capacitance region of the left sub-pixel.

Since the third electrode 30 is connected to the first gate electrode 16 of the right sub-pixel, and the first gate electrode 16 of the right sub-pixel is connected to the second drain electrode 29, it is thus equivalent to that the third electrode 30 is connected to the second drain electrode 29 of the right sub-pixel, and potentials of the first gate electrode 16 of the right sub-pixel and the second drain electrode 29 of the right sub-pixel are the same as a potential of the third electrode 30. Since the pixel electrode 40 of the right sub-pixel is connected to the third drain electrode 39 of the right sub-pixel, and the fourth electrode 35 is an integrated structure connected to the pixel electrode 40 of the right sub-pixel, it is thus equivalent to that the fourth electrode 35 is connected to the third drain electrode 39 of the right sub-pixel. Meanwhile, since the third drain electrode 39 of the right sub-pixel is also connected to the first drain electrode 19 of the right sub-pixel, potentials of the first drain electrode 19, the third drain electrode 39 and the pixel electrode 40 of the right sub-pixel are the same as a potential of the fourth electrode 35. In this way, the third electrode 30 and the fourth electrode 35 serve as two electrode plates forming a second storage capacitor $C_{ST}$, with the third electrode 30 being a lower electrode plate and the fourth electrode 35 being an upper electrode plate.

A subsequent preparation process includes forming structures such as a light-emitting layer, a cathode, an encapsulation layer, etc, and a preparation mode is the same as that in the related technology, which will not be repeated here.

Figure 21:
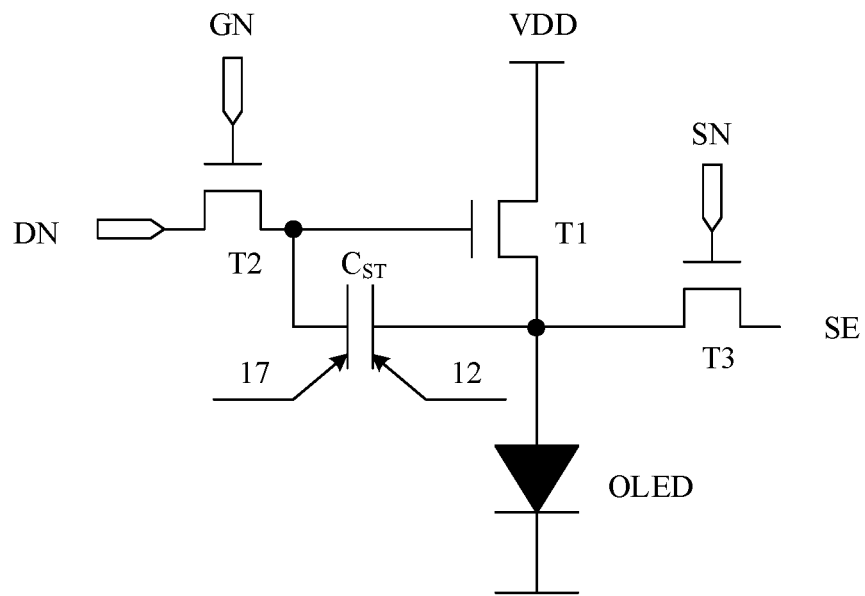
FIG. 21 is a schematic diagram of an equivalent circuit of a left sub-pixel in the embodiment of the present disclosure shown in FIG. 5.
Figure 22:
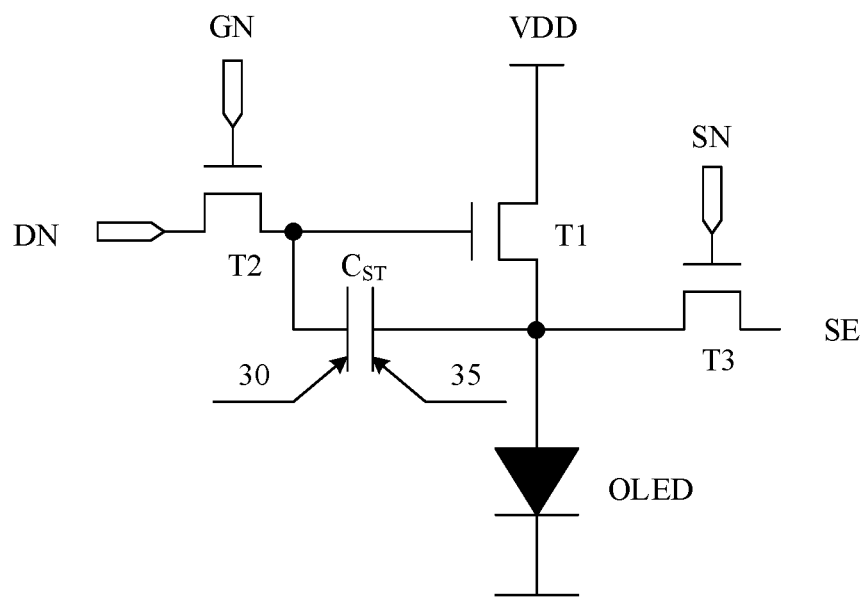
FIG. 22 is a schematic diagram of an equivalent circuit of a right sub-pixel in the embodiment of the present disclosure shown in FIG. 5.

FIG. 21 is a schematic diagram of an equivalent circuit of a left sub-pixel according to a first embodiment of the present disclosure, and FIG. 22 is a schematic diagram of an equivalent circuit of a right sub-pixel according to the first embodiment of the present disclosure. In the present embodiment, a first active layer 14, a first gate electrode 16, a first source electrode 18 and a first drain electrode 19 constitute a first transistor T1, a second active layer 24, a second gate electrode 26, a second source electrode 28 and a second drain electrode 29 constitute a second transistor T2, and a third active layer 34, a third gate electrode 36, a third source electrode 38 and a third drain electrode 39 constitute a third transistor T3, wherein, the first transistor T1 is a drive transistor, the second transistor T2 is a switch transistor, and the third capacitor T3 is a compensation transistor.

As shown in FIG. 21, for the left sub-pixel, a first storage capacitor $C_{ST}$ is formed by a first electrode 12 and a second electrode 17, wherein the first electrode 12 is a lower electrode plate and the second electrode 17 is an upper electrode plate. Herein, the first gate electrode 16 of the first transistor T1 is connected to the second drain electrode 29 of the second transistor T2 and the first storage capacitor $C_{ST}$, as the second electrode 17 of the upper electrode plate, the first source electrode 18 of the first transistor T1 is connected to a power supply line VDD, and the first drain electrode 19 of the first transistor T1 is connected to the third drain electrode 39 of the third transistor T3 and the first storage capacitor $C_{ST}$, as the first electrode 12 of the lower electrode plate. The second gate electrode 26 of the second transistor T2 is connected to a switch scan line GN, the second source electrode 28 of the second transistor T2 is connected to a data line DN, and the second drain electrode 29 of the second transistor T2 is connected to the first gate electrode 16 of the first transistor T1 and the first storage capacitor $C_{ST}$, as the second electrode 17 of the upper electrode plate. A third gate electrode 36 of the third transistor T3 is connected to a compensation scan line SN, the third source electrode 38 of the third transistor T3 is connected to a compensation line SE, and the third drain electrode 39 of the third transistor T3 is connected to the first drain electrode 19 of the first transistor T1 and the first storage capacitor $C_{ST}$, as the first electrode 12 of the lower electrode plate.

As shown in FIG. 22, for the right sub-pixel, the second storage capacitor $C_{ST}$ is formed by a third electrode 30 and a fourth electrode 35, with the third electrode 30 being a lower electrode plate and the fourth electrode 35 being an upper electrode plate. Herein, the first gate electrode 16 of the first transistor T1 is connected to the second drain electrode 29 of the second transistor T2 and the second storage capacitor $C_{ST}$, as the third electrode 30 of the lower electrode plate, the first source electrode 18 of the first transistor T1 is connected to the power supply line VDD, and the first drain electrode 19 of the first transistor T1 is connected to the third drain electrode 39 of the third transistor T3 and the second storage capacitor $C_{ST}$, as the fourth electrode 35 of the upper electrode plate. The second gate electrode 26 of the second transistor T2 is connected to the switch scan line GN, the second source electrode 28 of the second transistor T2 is connected to the data line DN, and the second drain electrode 29 of the second transistor T2 is connected to the first gate electrode 16 of the first transistor T1 and the first storage capacitor $C_{ST}$, as the third electrode 30 of the lower electrode plate. The third gate electrode 36 of the third transistor T3 is connected to the compensation scan line SN, the third source electrode 38 of the third transistor T3 is connected to the compensation line SE, and the third drain electrode 39 of the third transistor T3 is connected to the first drain electrode 19 of the first transistor T1 and the second storage capacitor $C_{ST}$, as the fourth electrode 35 of the upper electrode plate.

Figure 23:
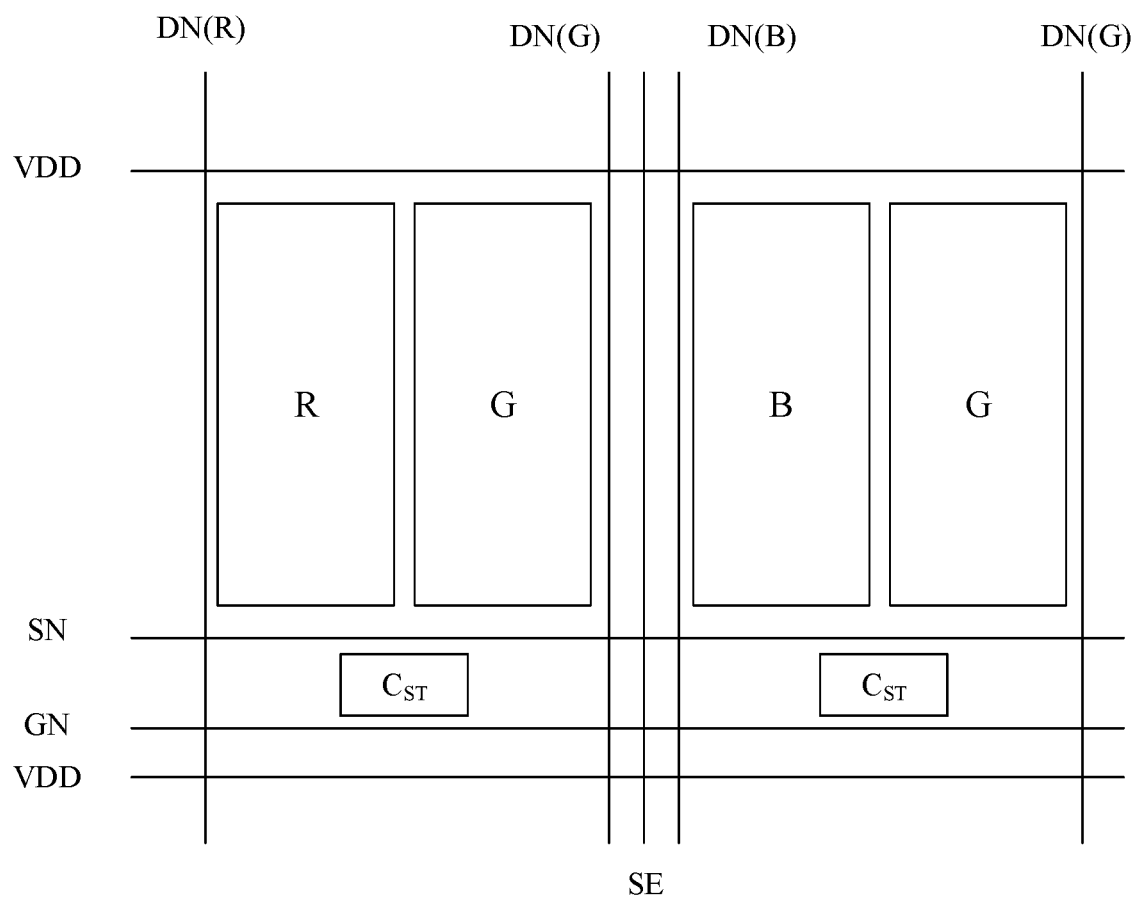
FIG. 23 is a schematic diagram of sub-pixel arrangement in the embodiment of the present disclosure shown in FIG. 5.

FIG. 23 is a schematic diagram of sub-pixel arrangement in the first embodiment of the present disclosure. In the present embodiment, the display substrate includes multiple pixel units arranged in a matrix, wherein each pixel unit includes four sub-pixels arranged in red (R), green (G), blue (B) and green (G). Herein, capacitance regions of an R sub-pixel and a G sub-pixel are combined as a shared capacitance region of the R sub-pixel and the G sub-pixel, and capacitance regions of a B sub-pixel and a G sub-pixel are combined as a shared capacitance region of the B sub-pixel and the G sub-pixel. In the present embodiment, four sub-pixels are arranged in RGBG, which may be understood as one pixel unit including two sub-pixel units, each sub-pixel unit including two sub-pixels, a first sub-pixel unit including a R sub-pixel and a G sub-pixel, and a second sub-pixel unit including a B sub-pixel and a G sub-pixel. When various colors are shown, the first sub-pixel unit borrows a missing B sub-pixel from an adjacent second sub-pixel unit to form three primary color sub-pixels RGB. Similarly, the second sub-pixel unit borrows a missing R sub-pixel from an adjacent first sub-pixel unit to form three primary color sub-pixels RGB. It may be seen that the resolution may be improved by adopting an RGBG arrangement in the present embodiment, and the resolution may reach 1.5 times of an existing RGB arrangement.

It may be seen from the structure of the display substrate and the preparation process thereof in the present embodiment that the capacitance region sharing and storage capacitor stacking are realized by using the stacked structure in the display substrate in the present embodiment, so as to reduce an area of each sub-pixel capacitance region and finally improve a pixel aperture ratio. In an example, in the present embodiment, capacitance regions of two adjacent sub-pixels are combined together to serve as a shared capacitance region of the two sub-pixels, and an electrode plate constituting a storage capacitor of each sub-pixel is disposed in the shared capacitance region. Two electrode plates of one sub-pixel are respectively a first electrode disposed in a same layer as a shielding layer and a second electrode disposed in a same layer as a gate electrode, a formed storage capacitor being located at a lower layer of the pixel drive circuit, and two electrode plates of the other sub-pixel are respectively a third electrode disposed in a same layer as source-drain electrodes and a fourth electrode disposed in a same layer as a pixel electrode, a formed storage capacitor being located at an upper layer of the pixel drive circuit, so that the storage capacitors of the two sub-pixels form a stacked structure of upper and lower layers. In the present embodiment, when an area of the capacitance region of each sub-pixel is the same as that of a sub-pixel with a related structure, an area of each sub-pixel electrode plate in the present embodiment has almost doubled, which greatly increases a capacity of a storage capacitor. Even if it is applied to a smaller pixel size, a required capacity of a storage capacitor can also be ensured, which is beneficial to realizing high-resolution display. In the present embodiment, when a capacity of the storage capacitor of each sub-pixel is the same as that of a sub-pixel with a related structure, an area of the shared capacitance region of the two sub-pixels just needs to be designed slightly larger than that of the capacitance region of a sub-pixel with a related structure, so that the area of the capacitance region of each sub-pixel is only about a half of that of the capacitance region of a sub-pixel with a related structure, thereby greatly reducing the area of the capacitance region of each sub-pixel, decreasing a proportion of a pixel area occupied by a drive circuit region of each sub-pixel, and being able to increase the pixel aperture ratio by at least 10% under high PPI. Therefore, the display substrate structure of the present embodiment saves an area occupied by the capacitor in the layout, improves the pixel aperture ratio, is applicable to high PPI display, reduces the power consumption, and avoids problems such as life-span decay of luminescent materials.

In an example, the display substrate of the present embodiment realizes a storage capacitor structure of one sub-pixel by using three layers of a first electrode disposed in a same layer as a shielding layer, a buffer layer and a second electrode disposed in a same layer as a gate electrode, realizes a storage capacitor structure of another sub-pixel by using three layers of a third electrode disposed in a same layer as source and drain electrodes, a passivation layer and a fourth electrode disposed in a same layer as a pixel electrode, and potentials of the second electrode and the gate electrode are same and potentials of the third electrode and the gate electrode are same, so Vs potentials of the two storage capacitors may be disposed as the first electrode at the bottom layer and the fourth electrode at the top layer, and a Vg signal is applied to the second electrode and the third electrode in the middle, which effectively reduces crosstalk between signals, and has less influence between the two storage capacitors, ensuring working stability and reliability.

In an example, a design of arranging of sub-pixels and traces of the display substrate in the present embodiment is reasonable. In a horizontal direction, a storage capacitor is located between two data lines DN, and in a vertical direction, the storage capacitor is located between a switch scan line GN and a compensation scan line SN. Meanwhile, the storage capacitor is disposed between multiple thin film transistors without jumpers thereon, and positions of multiple signal traces are more concentrated, which may reduce haze, improve display effect and effectively ensure yield.

In an example, no new processes are added and no new materials are introduced to the preparation of the display substrate in the present embodiment, which has good process compatibility, high process feasibility, strong practicability, and good application prospects.

To sum up, the present embodiment effectively improves pixel aperture ratio of the bottom emission type OLED without increasing cost and sacrificing yield, which is conducive to realization of high-resolution display and effectively solves defect of lower pixel aperture ratio existing in an existing solution.

Figure 24:
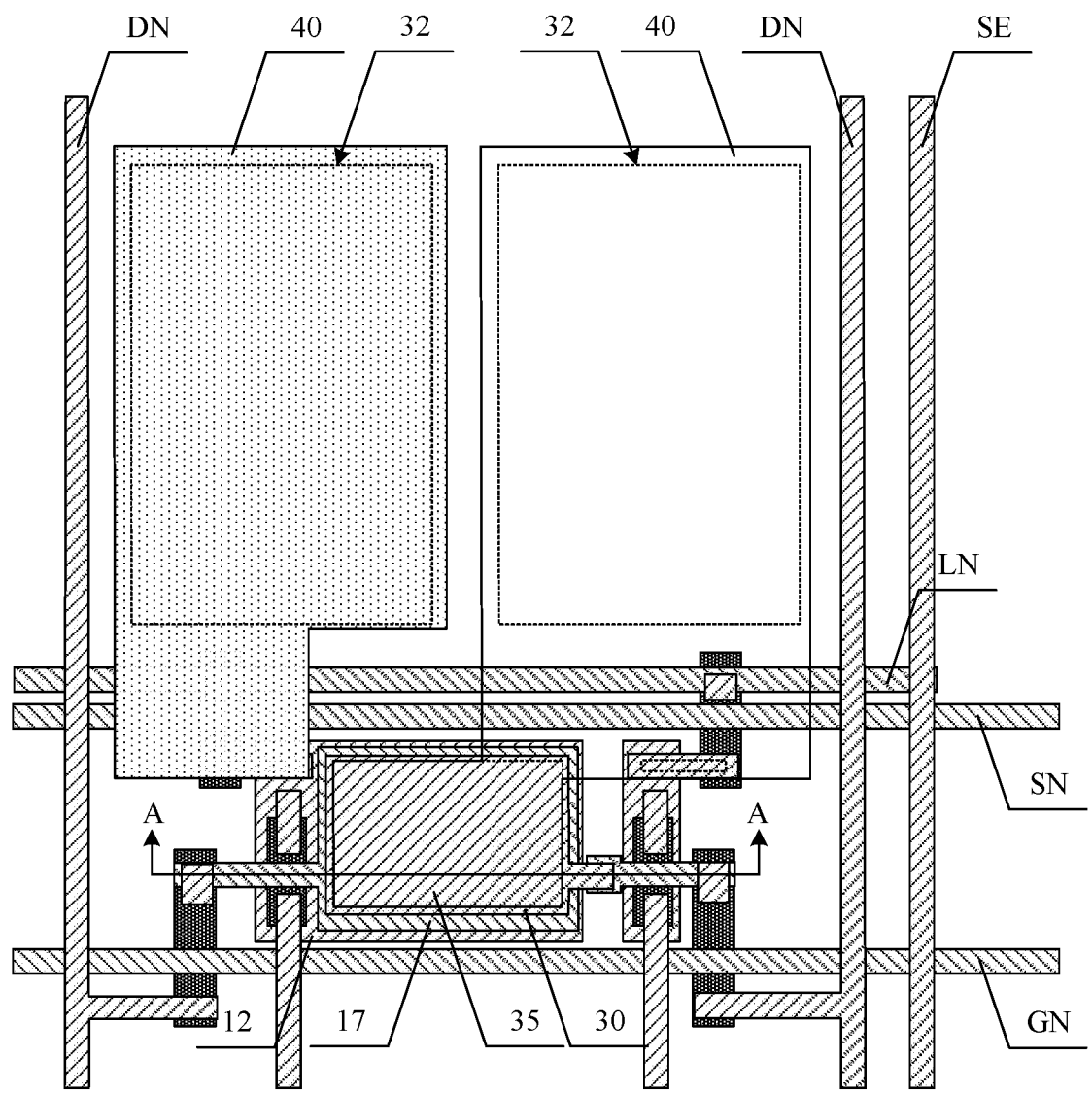
FIG. 24 is a schematic structural diagram of another exemplary embodiment of a display substrate according to the present disclosure.

FIG. 24 is a schematic structural diagram of another exemplary embodiment according to the display substrate of the present disclosure. The main structure of the base substrate in the present embodiment is basically the same as that of the aforementioned first embodiment, except that a color filter layer is further disposed between a fourth insulating layer and a fifth insulating layer in the present embodiment. As shown in FIG. 24, a color filter layer 32 is located in a light-emitting region of each sub-pixel, and is disposed on a fourth insulating layer 31 and covered by a fifth insulating layer 33. The structure of the foregoing embodiment is applicable to a light-emitting layer emitting light of the desired color, and the structure of the present embodiment is applicable to the light emitting layers of all sub-pixels emitting light of the same color, and each sub-pixel emitting light of the desired color is realized through filtering of the color filter layer 32.

The preparation process of the base substrate in the present embodiment is basically the same as that of the aforementioned first embodiment, except that a pattern of a color filter layer is formed between act (5) and act (6). In the present example, the fourth insulating thin film and a color filter thin film are sequentially deposited on the base substrate where the pattern in act (5) is completed, and the fourth insulating layer 31 covering the aforementioned structure and a pattern of the color filter layer 32 on the fourth insulating layer 31 are formed by masking, exposing and developing the color filter thin film. Herein, a color filter layer 32 of the left sub-pixel has the same structure as a color filter layer 32 of the right sub-pixel, but colors of the color filter layers 32 are different. For example, the color filter layer 32 of the left sub-pixel is a red color filter, and the color filter layer 32 of the right sub-pixel is a green color filter. For another example, the color filter layer 32 of the left sub-pixel is a blue color filter, and the color filter layer 32 of the right sub-pixel is a green color filter. Subsequently, the processes such a coating the fifth insulating thin film in act (6) is performed.

The present embodiment similarly achieves the technical effects of the previous embodiments, including effectively improving pixel aperture ratio of the bottom emission type OLED, which is conducive to realizing high-resolution display.

The pixel unit including 4 sub-pixels is taken for elaboration in the aforementioned embodiments, but in fact, the embodiment of the present disclosure may be applicable to a structure where a pixel unit includes 3 sub-pixels. Taking a pixel unit including RGB sub-pixels as an example, capacitance regions of an R sub-pixel and a B sub-pixel may be combined as a shared capacitance region of the two sub-pixels, a structural arrangement mode proposed in the embodiment of the present disclosure is adopted in the two sub-pixels, while a capacitance region of a G sub-pixel is taken as a separate capacitance region, and a structural arrangement mode with a related technology may be adopted in the sub-pixel. In actual implementation, the trace design may be optimized to match the display substrate structure of the present disclosure.

Based on the aforementioned embodiments, an embodiment of the present disclosure also provides a method for preparing a display substrate, so as to prepare the display substrate of the previous embodiments.

The method for preparing the display substrate according to the embodiment of the present disclosure includes: multiple sub-pixels arranged in a matrix are formed, wherein each sub-pixel is formed with a pixel drive circuit including multiple thin film transistors and a storage capacitor; the storage capacitor of a present sub-pixel and the storage capacitor of an adjacent sub-pixel are formed in a shared capacitance region of the two sub-pixels; and the storage capacitor of the present sub-pixel and the storage capacitor of the adjacent sub-pixel are disposed as stacked layers.

In an exemplary embodiment, the storage capacitor of a present sub-pixel is formed in a shared capacitance region of the two sub-pixels, includes: a first electrode disposed in a same layer as a light shield layer in the pixel drive circuit is formed, wherein the first electrode is formed in the shared capacitance region of the two sub-pixels; an insulating layer covering the first electrode is formed; and a second electrode disposed in a same layer as gate electrodes of the thin film transistors is formed, wherein the second electrode is formed in the shared capacitance region of the two sub-pixels.

In an exemplary embodiment, the storage capacitor of an adjacent sub-pixel is formed in a shared capacitance region of the two sub-pixels, includes: a third electrode disposed in a same layer as source and drain electrodes of the thin film transistors is formed, wherein the third electrode is formed in the shared capacitance region of the two sub-pixels; an insulating layer covering the third electrode is formed; and a fourth electrode disposed in a same layer as a pixel electrode is formed, wherein the fourth electrode is formed in the shared capacitance region of the two sub-pixels.

In an exemplary embodiment, forming a pixel drive circuit includes: forming a light shield layer and a first electrode on a base substrate, wherein the first electrode is formed in the shared capacitance region of the two sub-pixels; forming a first insulating layer covering the light shield layer and the first electrode; forming an active layer on the first insulating layer; forming a second insulating layer covering the active layer; and forming gate electrodes and a second electrode on the second insulating layer, wherein the second electrode is formed in the shared capacitance region of the two sub-pixels, and the first electrode and the second electrode form the storage capacitor of the present sub-pixel.

In an exemplary embodiment, forming a pixel drive circuit further includes: forming a third insulating layer covering the gate electrodes and the second electrode; forming source electrodes, drain electrodes and a third electrode on the third insulating layer, wherein the third electrode is formed in the shared capacitance region of the two sub-pixels; forming a fourth insulating layer and a fifth insulating layer covering the source electrodes, the drain electrodes and the third electrode; and forming a pixel electrode and a fourth electrode on the fifth insulating layer, wherein the fourth electrode is formed in the shared capacitance region of the two sub-pixels, and the third electrode and the fourth electrode form the storage capacitor of the adjacent sub-pixel.

In an exemplary embodiment, forming a light shield layer and a first electrode on a base substrate includes: forming a light shield layer of the present sub-pixel and a light shield layer of the adjacent sub-pixel on the base substrate, wherein the light shield layer of the present sub-pixel and the first electrode are in an integrated structure.

In an exemplary embodiment, forming gate electrodes and a second electrode on the second insulating layer includes: forming a first, a second and a third gate electrodes of the present sub-pixel and a first, a second and a third gate electrodes of the adjacent sub-pixel on the second insulating layer, wherein the first gate electrode of the present sub-pixel and the second electrode are in an integrated structure.

In an exemplary embodiment, forming a pixel electrode and a fourth electrode on the fifth insulating layer includes: forming a pixel electrode of the present sub-pixel and a pixel electrode of the adjacent sub-pixel on the fifth insulating layer, wherein the pixel electrode of the adjacent sub-pixel and the fourth electrode are in an integrated structure and the pixel electrode of the adjacent sub-pixel is connected to a first drain electrode and a third drain electrode of the adjacent sub-pixel through a via hole.

In an exemplary embodiment, forming source electrodes, drain electrodes and a third electrode on the third insulating layer includes: forming a data line, a compensation line, a first source electrode, a first drain electrode, a second source electrode, a second drain electrode, a third source electrode, a third drain electrode and a third electrode on the third insulating layer.

In an exemplary embodiment, the compensation line is connected to a connection line through a via hole; the first source electrode is connected to a first active layer through a via hole, and the first drain electrode is simultaneously connected to the first active layer and a light shield layer through the via hole, so that the first drain electrode of the present sub-pixel is connected to the first electrode; the second source electrode and the data line are in an integrated structure, the second source electrode is connected to a second active layer through a via hole, and the second drain electrode is simultaneously connected to the second active layer and the first gate electrode through the via hole, so that the second drain electrode of the present sub-pixel is connected to the second electrode; the third source electrode is simultaneously connected to the connection line and a third active layer through a via hole, and the third drain electrode is simultaneously connected to the third active layer and the light shield layer through the via hole, so that the third drain electrode of the present sub-pixel is connected to the first electrode; and the third electrode is connected to the first gate electrode of the adjacent sub-pixel through the via hole.

In an exemplary embodiment, forming a fourth insulating layer and a fifth insulating layer covering the source electrodes, the drain electrodes and the third electrode includes: forming a fourth insulating layer covering the source electrodes, the drain electrodes and the third electrode; forming a color filter layer on the fourth insulating layer; and forming a fifth insulating layer covering the color filter layer.

In an exemplary embodiment, forming a fifth insulating layer covering the color filter layer includes: forming a via hole exposing the fourth insulating layer on the fifth insulating layer, and the via hole is configured to dispose the fourth electrode.

The process for preparing the display substrate has been described in detail in the previous embodiments and will not be repeated here.

The method for preparing the display substrate according to the embodiments of the present disclosure similarly realizes, on a premise that cost is not increased and yield is not sacrificed, that pixel aperture ratio of bottom emission type OLED is effectively improved, which is conducive to realization of high-resolution display.

An embodiment of the present disclosure further provides a display apparatus, including the display substrate described above. The display apparatus may be any product or component with a display function such as a mobile phone, a tablet computer, a television, a display, laptop, a digital photo frame, or a navigator, etc.

In the description of the embodiments of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or the element referred to must have a specific orientation, or be constructed and operated in a specific orientation, and thus cannot be interpreted as a limitation on the present disclosure.

In the description of the embodiments of the present disclosure, it should be noted that the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. Those of ordinary skills in the art may understand the meanings of the above mentioned terms in the present disclosure according to a situation.

Although the embodiments disclosed in the present disclosure are as described above, the described contents are only the embodiments for facilitating understanding of the present disclosure, and are not intended to limit the present disclosure. A person skilled in the art to which the present disclosure pertains may make any modifications and variations in the form and details of implementation without departing from the spirit and the scope of the present disclosure. Nevertheless, the scope of patent protection of the present disclosure shall still be determined by the scope defined by the appended claims.

What is claimed is:

1. A display substrate, comprising a plurality of sub-pixels arranged in a matrix, wherein each sub-pixel is provided with a pixel drive circuit comprising a plurality of thin film transistors and a storage capacitor, the storage capacitor of a present sub-pixel in the plurality of sub-pixels and the storage capacitor of an adjacent sub-pixel adjacent to the present sub-pixel are disposed in a shared capacitance region of the present sub-pixel and the adjacent sub-pixel, and the storage capacitor of the present sub-pixel and the storage capacitor of the adjacent sub-pixel are disposed as stacked layers, wherein the pixel drive circuit comprises:
a base substrate;
a light shield layer and a first electrode disposed on the base substrate, wherein the first electrode is disposed in the shared capacitance region;
a first insulating layer covering the light shield layer and the first electrode;
an active layer disposed on the first insulating layer;
a second insulating layer covering the active layer; and
gate electrodes and a second electrode disposed on the second insulating layer, wherein the second electrode is disposed in the shared capacitance region, and the first electrode and the second electrode form the storage capacitor of the present sub-pixel, wherein the pixel drive circuit further comprises:
a third insulating layer covering the gate electrodes and the second electrode;
source electrodes, drain electrodes and a third electrode disposed on the third insulating layer, wherein the third electrode is disposed in the shared capacitance region;
a fourth insulating layer and a fifth insulating layer covering the source electrodes, the drain electrodes and the third electrode; and
a pixel electrode and a fourth electrode disposed on the fifth insulating layer, wherein the fourth electrode is disposed in the shared capacitance region, and the third electrode and the fourth electrode form the storage capacitor of the adjacent sub-pixel, wherein the pixel drive circuit further comprises a switch scan line, a compensation scan line and a data line, and the shared capacitance region is disposed between two data lines in a horizontal direction and between the switch scan line and the compensation scan line in a vertical direction.

2. The display substrate of claim 1, wherein the storage capacitor of the present sub-pixel comprises:
a first electrode disposed in a same layer as a light shield layer in the pixel drive circuit, an insulating layer covering the first electrode, and a second electrode disposed in a same layer as gate electrodes of the thin film transistors.

3. The display substrate of claim 1, wherein the storage capacitor of the adjacent sub-pixel comprises:
a third electrode disposed in a same layer as source and drain electrodes of the thin film transistors, an insulating layer covering the third electrode, and a fourth electrode disposed in a same layer as a pixel electrode.

4. The display substrate of claim 1, wherein the plurality of thin film transistors comprise a first thin film transistor, a second thin film transistor and a third thin film transistor,
the first thin film transistor comprises a first active layer, a first gate electrode, a first source electrode and a first drain electrode,
the second thin film transistor comprises a second active layer, a second gate electrode, a second source electrode and a second drain electrode, and
the third thin film transistor comprises a third active layer, a third gate electrode, a third source electrode and a third drain electrode.

5. The display substrate of claim 4, wherein in the present sub-pixel, the first electrode and the light shield layer are in an integrated structure, and the first electrode is connected to the first drain electrode and the third drain electrode through a via hole; the second electrode and the first gate electrode are in an integrated structure, and the second electrode is connected to the second drain electrode through a via hole.

6. The display substrate of claim 4, wherein in the adjacent sub-pixel, the third electrode is connected to the first gate electrode and the second drain electrode through a via hole, the fourth electrode and the pixel electrode are in an integrated structure, and the fourth electrode is connected to the first drain electrode and the third drain electrode through a via hole.

7. The display substrate of claim 1, further comprising a color filter layer, wherein the color filter layer is disposed between the fourth insulating layer and the fifth insulating layer, the fifth insulating layer is opened with a via hole exposing the fourth insulating layer, and the fourth electrode is disposed in the via hole.

8. A display apparatus, comprising a display substrate according to claim 1.

9. A method for preparing a display substrate, comprising:
forming a plurality of sub-pixels arranged in a matrix, forming a pixel drive circuit comprising a plurality of thin film transistors and a storage capacitor in each sub-pixel, wherein the storage capacitor of a present sub-pixel in the plurality of sub-pixels and the storage capacitor of an adjacent sub-pixel adjacent to the present sub-pixel are formed in a shared capacitance region of the present sub-pixel and the adjacent sub-pixel, and the storage capacitor of the present sub-pixel and the storage capacitor of the adjacent sub-pixel are disposed as stacked layers, wherein forming the pixel drive circuit comprises:
forming a light shield layer and a first electrode on a base substrate, wherein the first electrode is formed in the shared capacitance region;
forming a first insulating layer covering the light shield layer and the first electrode;
forming an active layer on the first insulating layer;
forming a second insulating layer covering the active layer; and
forming gate electrodes and a second electrode on the second insulating layer, wherein the second electrode is formed in the shared capacitance region, and the first electrode and the second electrode form the storage capacitor of the present sub-pixel, wherein forming the pixel drive circuit further comprises:
forming a third insulating layer covering the gate electrodes and the second electrode;
forming source electrodes, drain electrodes and a third electrode on the third insulating layer, wherein the third electrode is formed in the shared capacitance region;
forming a fourth insulating layer and a fifth insulating layer covering the source electrodes, the drain electrodes and the third electrode; and
forming a pixel electrode and a fourth electrode on the fifth insulating layer, wherein the fourth electrode is formed in the shared capacitance region, and the third electrode and the fourth electrode form the storage capacitor of the adjacent sub-pixel, wherein forming the fourth insulating layer and the fifth insulating layer covering the source electrodes, the drain electrodes and the third electrode comprises:
forming the fourth insulating layer covering the source electrodes, the drain electrodes and the third electrode;
forming a color filter layer on the fourth insulating layer;
forming the fifth insulating layer covering the color filter layer, forming a via hole exposing the fourth insulating layer on the fifth insulating layer, wherein the via hole is configured to dispose the fourth electrode.

10. The method for preparing the display substrate of claim 9, wherein forming the storage capacitor of the present sub-pixel in the shared capacitance region, comprises:
forming a first electrode disposed in a same layer as a light shield layer in the pixel drive circuit, wherein the first electrode is formed in the shared capacitance region;
forming an insulating layer covering the first electrode; and
forming a second electrode disposed in a same layer as gate electrodes of the thin film transistors, wherein the second electrode is formed in the shared capacitance region.

11. The method for preparing the display substrate of claim 9, wherein forming the storage capacitor of the adjacent sub-pixel in the shared capacitance region, comprises:
- forming a third electrode disposed in a same layer as source and drain electrodes of the thin film transistors, wherein the third electrode is formed in the shared capacitance region;
- forming an insulating layer covering the third electrode; and
- forming a fourth electrode disposed in a same layer as a pixel electrode, wherein the fourth electrode is formed in the shared capacitance region.

12. The method for preparing the display substrate of claim 9, wherein,
- forming the light shield layer and the first electrode on the base substrate comprises forming a light shield layer of the present sub-pixel and a light shield layer of the adjacent sub-pixel on the base substrate, wherein the light shield layer of the present sub-pixel and the first electrode are in an integrated structure;
- forming the gate electrodes and the second electrode on the second insulating layer comprises forming a first, a second and a third gate electrodes of the present sub-pixel and a first, a second and a third gate electrodes of the adjacent sub-pixel on the second insulating layer, wherein the first gate electrode of the present sub-pixel and the second electrode are in an integrated structure; and
- forming the pixel electrode and the fourth electrode on the fifth insulating layer comprises forming a pixel electrode of the present sub-pixel and a pixel electrode of the adjacent sub-pixel on the fifth insulating layer, wherein the pixel electrode of the adjacent sub-pixel and the fourth electrode are in an integrated structure and the pixel electrode of the adjacent sub-pixel are connected to a first drain electrode and a third drain electrode of the adjacent sub-pixel through a via hole.

13. The method for preparing the display substrate of claim 12, wherein forming source electrodes, drain electrodes and a third electrode on the third insulating layer comprises:
- forming a data line, a compensation line, a first source electrode, a first drain electrode, a second source electrode, a second drain electrode, a third source electrode, a third drain electrode and the third electrode on the third insulating layer.

14. The method for preparing the display substrate of claim 13, wherein,
- the compensation line is connected to a connection line through a via hole;
- the first source electrode is connected to a first active layer through a via hole, and the first drain electrode is simultaneously connected to the first active layer and the light shield layer through a via hole, so that the first drain electrode of the present sub-pixel is connected to the first electrode;
- the second source electrode and the data line are in an integrated structure, the second source electrode is connected to a second active layer through a via hole, and the second drain electrode is simultaneously connected to the second active layer and the first gate electrode through the via hole, to make the second drain electrode of the present sub-pixel be connected to the second electrode;
- the third source electrode is simultaneously connected to the connection line and a third active layer through a via hole, and the third drain electrode is simultaneously connected to the third active layer and the light shield layer through the via hole, to make the third drain electrode of the present sub-pixel be connected to the first electrode; and
- the third electrode is connected to the first gate electrode of the adjacent sub-pixel through a via hole.

* * * * *